United States Patent
Baba et al.

(10) Patent No.: US 6,489,558 B1
(45) Date of Patent: Dec. 3, 2002

(54) CONDUCTIVE CAP, ELECTRONIC COMPONENT, AND METHOD OF FORMING INSULATING FILM OF CONDUCTIVE CAP

(75) Inventors: Toshiyuki Baba, Moriyama (JP); Toshio Nishimura, Shiga-ken (JP); Tsuyoshi Kitagawa, Toyama-ken (JP); Jiro Inoue, Omihachiman (JP); Shoichi Kawabata, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/642,486

(22) Filed: Aug. 18, 2000

(30) Foreign Application Priority Data

Aug. 18, 1999 (JP) .............................................. 11-231988
Aug. 18, 1999 (JP) .............................................. 11-231989
Oct. 7, 1999 (JP) .............................................. 11-287217

(51) Int. Cl.[7] .............................................. H01L 23/02
(52) U.S. Cl. ..................... 174/52.4; 174/52.3; 257/704; 257/710
(58) Field of Search ................. 174/52.1, 52.3, 174/52.4; 310/340, 344, 348; 257/704, 708, 709, 710

(56) References Cited

U.S. PATENT DOCUMENTS

| | | | | |
|---|---|---|---|---|
| 4,939,316 A | * | 7/1990 | Mahulikar et al. | 174/52.4 |
| 5,477,008 A | * | 12/1995 | Pasqualoni et al. | 174/52.3 |
| 5,825,120 A | * | 10/1998 | Maesaka et al. | 310/340 |
| 5,844,452 A | * | 12/1998 | Yamamoto et al. | 310/348 |
| 6,064,142 A | * | 5/2000 | Yamamoto | 310/344 |

FOREIGN PATENT DOCUMENTS

| | | | | |
|---|---|---|---|---|
| JP | 62-158828 | | 10/1987 | |
| JP | 6-132762 | | 5/1994 | |
| JP | 06132766 A | * | 5/1994 | ............ H03H/9/02 |
| JP | 8-204491 | | 8/1996 | |

\* cited by examiner

Primary Examiner—Dean A. Reichard
Assistant Examiner—Camelo Oliva
(74) Attorney, Agent, or Firm—Keating & Bennett, LLP

(57) ABSTRACT

A conductive cap for use in an electronic component, has an opening at a bottom portion thereof, and is constructed to be fixed to the upper surface of a substrate of the electronic component at the opening portion of the cap so as to cover at least an electronic component element mounted on the upper surface of the substrate having terminal electrodes provided thereon. The end surface of the opening and the inner and outer surfaces thereof in connection to and in the vicinity of the end surface are provided with an insulating film disposed thereon.

9 Claims, 25 Drawing Sheets

CONDUCTIVE CAP, ELECTRONIC COMPONENT, AND METHOD OF FORMING INSULATING FILM OF CONDUCTIVE CAP

BACKGROUND OF THE INVENTION

1. Field of the Invention

The present invention relates to a conductive cap for covering an electronic element such as a piezoelectric element mounted on the upper surface of a substrate, an electronic component including such a conductive cap, and a method of forming an insulating film of the conductive cap.

2. Description of the Related Art

For conventional electronic component elements such as piezoelectric resonators or other suitable components, a package structure including a conductive cap has been used. Such a type of package structure will be described with reference to FIG. 6.

The package structure contains a substrate 51 having a rectangular sheet shape, made of an insulating material such as alumina, and a metallic cap 52. On the upper surface 51a of the substrate 51, terminal electrodes 53 and 54 for achieving external electric connection are provided. The terminal electrodes 53 and 54 each are extended onto the side surfaces, the end surfaces, and the lower surface, in addition to the upper surface 51a, so that the package structure can be surface-mounted onto a printed circuit board.

Further, a piezoelectric element is mounted onto the upper surface 51a of the substrate 51 by solder, a conductive bonding agent such as a conductive adhesive, or the like, though not shown in FIG. 6. The electrodes of the piezoelectric element are connected to the terminal electrodes 53 and 54, respectively.

For the purpose of sealing the piezoelectric element, a metallic cap 52 having an opening at the lower portion thereof is bonded to the substrate 51. A rectangular frame-shaped insulating film 55 is provided on the portion of the upper surface 51a of the substrate 51 that is arranged to be contacted with the end surface of the opening of the metallic cap 52. The insulating film 55 is formed by printing synthetic resin, or printing and baking glass. The thickness of the insulating film 55 is about 0.1 mm. Accordingly, the height of the chip electronic component to be produced can be reduced, even though the metallic cap 52 is used.

In recent years, it has been required to reduce the mounting areas of electronic components. With even greater miniaturization of components, it has been very difficult to print and form the insulating film 55 on the upper surface 51a of the substrate 51 with high precision.

Further, Japanese Unexamined Patent Application Publication No. 6-132762 discloses an electronic component 71 having a cap shown in FIG. 7. In this electronic component 71, terminal electrodes 73 and 74 each extends on the upper surface, the side surfaces, and lower surface of a substrate 72 made of an insulating material. A piezoelectric element 75 is bonded to the terminal electrodes 73 and 74 via solder members 76 and 77.

A metallic cap 78 is bonded to the upper surface of the substrate 72 by an insulating adhesive. In order to prevent the terminal electrodes 73 and 74 and the metallic cap 78 from short-circuiting, an insulating film 79 is disposed on the entire inner surface of the metallic cap 78.

In the prior art, no method of forming the insulating film 79 is specifically described. It is presumed that the insulating layer is precoated on a sheet material before the material is shaped into the metallic cap 78, and the precoated sheet material is formed to have the same shape as that of the cap.

When the metallic cap described in Japanese Unexamined Patent Application Publication No. 6-132762 is produced, the peripheral portion of the opening of the metallic cap 78 must be bent outward, as shown in FIG. 7, so that the insulating layer is always positioned on the portions of the terminal electrodes 73 and 74 to be contacted with the metallic cap 78. Accordingly, the process of producing the metallic cap 78 becomes complicated. Further, in some cases, when such bending work is carried out, the insulating layer 79 is peeled, making it impossible to reliably provide electrical insulation between the metallic cap 78 and the terminal electrodes 73 and 74.

In a chip electronic component in which an element such as a piezoelectric element or other electronic element is mounted onto a substrate, the piezoelectric vibration portion thereof is vibrated. As a result, the structure is such that the element is accommodated in a package that does not interfere with vibration of the element. After the element is mounted onto the surface of the substrate, a cap is fixed to the surface of the substrate to cover and seal the element.

FIG. 20 is a cross-sectional view showing an example of another conventional electronic component sealed with such a cap. In the conventional electronic component shown in FIG. 20, an insulating cap 30 is used. This is because the cap 30 is fixed to terminal electrodes 11 and 12 provided on a substrate 10 and must be insulative in order to prevent the terminal electrodes 11 and 12 from short-circuiting. An element such as a piezoelectric resonator is mounted onto the upper surface of the substrate 10. The element 20 is bonded to the terminal electrode 11 via solder 21 and the terminal electrode 12 with solder 22. A terminal electrode 13 is provided between the terminal electrodes 11 and 12 between the terminal electrodes 11 and 12 on the lower surface of the substrate 10 to produce a capacitor between the terminal electrodes 11, 12 and 13.

As the insulating cap 30, a ceramic cap, a resin cap, or other cap is used. However, these caps must have a thickness of 0.25 mm or larger because of the forming capabilities and limitations. Accordingly, it is not possible to reduce the height of the electronic component, and the area of the substrate becomes larger.

For the purpose of reducing the height of the electronic component and enhancing the integration density of the circuit board, it is preferable to use a metallic cap. However, if the metallic cap alone is fixed to the substrate, the terminal electrodes short-circuit, as described above.

In order to prevent the terminal electrodes from short-circuiting as described above, a method in which an insulating layer 31 is disposed on the substrate 10 and the terminal electrodes 11 and 12 onto which the metallic cap 32 is to be mounted, and the cap 31 is mounted onto the insulating layer 31, as shown in FIG. 21. In FIG. 21, elements such as a piezoelectric resonation element mounted onto the substrate 10 are omitted.

According to a method as described above, the metallic cap can be used. Thus, the height of an electronic component can be reduced. On the other hand, there arises the problem that with further miniaturization of the electronic component, it becomes more difficult to form the insulating layer on the substrate with high precision.

Japanese Unexamined Utility Model Application Publication No. 62-158828 and Japanese Unexamined Patent Application Publication No. 8-204491 disclose an electronic component provided with a metallic cap that is made of an aluminum sheet having an anodized film on the surface thereof. However, for the metallic cap, a sheet material is anodized. Therefore, in the case where the sheet material is formed into a cap shape, the end surfaces of the cap to be contacted with terminal electrodes on a substrate have no anodized films thereon. Accordingly, the terminal electrodes can not be prevented from short-circuiting.

Moreover, Japanese Unexamined Patent Application Publication No. 6-132762 discloses a metallic cap provided with an insulating layer disposed on the inner surface thereof. Such a metallic cap is shaped so that the end portions of the cap to be contacted with a substrate are bent outward, and the inner surface of the cap can be contacted with terminal electrodes. Accordingly, the insulating layer disposed on the inner surface is contacted with the terminal electrodes. Thus, the insulating layer is interposed between the metallic cap and the terminal electrodes, whereby the terminal electrodes can be prevented from short-circuiting.

In Japanese Unexamined Patent Application Publication No. 6-132762, a method of forming the insulating layer is not specifically described. It is presumed that the insulating layer is precoated on a sheet material before the material is formed in the metallic cap shape, and the precoated sheet material is formed into the cap shape. In the case of such a metallic cap, the end portions of the cap are bent outward so that the insulating layer on the end portions of the cap is positioned on the portions of the cap to be contacted with the terminal electrodes. Further, during bending, the insulating layer may be peeled so that the insulating properties become insufficient.

In some cases, it is necessary to provide an insulating layer for the outer surface of the metallic cap, so that insulation between the electronic component and other elements is maintained when the electronic component is mounted onto a circuit board. In Japanese Unexamined Patent Application Publication No. 6-132762, only a method of forming the insulating layer on the inner surface of the cap is disclosed.

SUMMARY OF THE INVENTION

In order to overcome the problems described above, preferred embodiments of the present invention provide a conductive cap that is adapted to be insulated from terminal electrodes on a substrate electrically and securely, is produced in a simple process, and reduces the size and height of an electronic component attributed to the conductive cap included in the component. Preferred embodiments of the present invention also provide an electronic component containing the conductive cap, and a method of forming an insulating film of the conductive cap.

According to a preferred embodiment of the present invention, a conductive cap for use in an electronic component including an opening at the lower portion thereof, and being adapted to be fixed to the upper surface of the substrate of the electronic component on the opening side of the cap so as to cover at least an electronic component element mounted on the upper surface of the substrate having terminal electrodes provided thereon, wherein the end surface of the opening and the inner and outer side surfaces thereof in connection to and in the vicinity of the end surface are provided with an insulating film disposed thereon.

The insulation resistance between the opening end surface of the conductive cap and the outer side of the insulation film may be at least about $10^9$ Ω.

The thickness of said insulating film may be in the range of about 4 μm to about 25 μm.

Preferably, when the opening end surface of the conductive cap and its adjacent portion thereof are viewed in a section taken perpendicularly relative to the circumferential direction of the conductive cap, the opening end surface of the cap and the inner side surface thereof in connection to the opening end surface define a curved line, and the radius R of curvature of the curved line is in the range of about 80 μm to about 150 μm.

According to another preferred embodiment of the present invention, an electronic component includes a substrate having a plurality of terminal electrodes provided at least on the upper surface thereof, an electronic component element fixed to the substrate and electrically connected to the plurality of terminal electrodes, and a conductive cap having an opening at the lower portion thereof, provided with an insulating film disposed on the opening end surface thereof and its vicinity and bonded to the substrate on the opening side thereof.

In the electronic component, the electronic component element may be a piezoelectric element or other suitable electronic component.

Further, in the electronic component, the conductive cap may be a metallic cap.

According to a preferred embodiment of the present invention, a method of forming an insulating film of a conductive cap includes the steps of holding a plurality of conductive caps each having an opening at the lower portion thereof while the conductive caps are arranged by a holding device, pressing the opening end surface of the plurality of conductive caps held by the holding device against a resin layer for forming an insulating film having a predetermined thickness, separating the conductive caps from the resin layer for forming an insulating film, whereby the insulating film is formed on the opening end surface of each conductive cap and its vicinity of the opening end surface by the transfer method, and drying the insulating film after the transfer step.

In the method, as the resin for forming an insulating film, a resin having a viscosity at about 25±5° C. of about 5000 to about 20000 cps may preferably be used.

According to another preferred embodiment of the present invention, a method of forming an insulating film of a conductive cap for sealing an electronic component includes the steps of providing a conductive cap that is adapted to be fixed to the surface of a substrate having terminal electrodes disposed thereon so as to cover and seal an element mounted to the surface of the substrate, the insulating film being adapted to electrically insulate the terminal electrodes from the metallic cap, wherein the conductive cap is made of aluminum or an alloy thereof, and forming an insulating film on the surface of the conductive cap by anodization carried out in the cap-shaped state.

As described above, the anodization is carried out in the cap-shaped state. Accordingly, the insulating film can be formed by the anodization on the surface portions of the conductive cap to be contacted with the terminal electrodes when the conductive cap is fixed to the surface of the substrate. Hence, such a metallic cap alone can be fixed to the surface of the substrate by an adhesive or other joining material or element to achieve sealing.

The anodization can be performed under the general anodization conditions. An oxidized film can be electrolytically formed on the metallic cap so as to define an anode. As an electrolyte, generally-used acidic electrolytes such as sulfuric acid, oxalic acid, chromic acid, and so forth may be preferably used.

Preferably, the anodization is carried out while the conductive cap is held by a jig and is electrically connected. As the jig, a conductive jig is preferably used, and is electrically connected to the metallic cap. The conductive cap as an anode is electrolytically treated. This method is suitable in the case where the conductive caps are individually separated and are separate from each other.

Preferably, the anodization is carried out while the conductive caps are connected to each other in a hoop-shape state. In the hoop-shape state, a sheet material and the caps are partially connected to each other after the sheet material is punched and shaped into caps.

In such a hoop-shape state, the anodization can be continuously carried out. That is, for the continuous anodization, the hoop wound around one roll or the like is unwound and fed into an anodization bath, and after the anodization, is taken up around the other roll. In this case, the electrical conduction state of the hoop can be kept by moving a contact for electrically connecting the hoop correspondingly to the movement of the hoop.

Further, the hoop cut to a predetermined unit length may be dipped into an anodization bath to be anodization-treated. In this case, by utilizing a piece for holding each cut hoop as a contact, the cut hoop can be electrically connected.

Further, according to another preferred embodiment of the present invention, there is provided a conductive cap for sealing an electronic component, the cap being adapted to be fixed to the surface of the substrate of the electronic component so as to cover and seal an element mounted onto the surface of the substrate having terminal electrodes disposed thereon, wherein the conductive cap is made of aluminum or an alloy thereof, and an insulating film is formed by anodization at least on the surface portions of the conductive cap to be contacted with the terminal electrodes.

The conductive cap of various preferred embodiments of the present invention can be produced according to the method of forming an insulating film of another preferred embodiment of the present invention. The conductive cap of various preferred embodiments of the present invention alone can be fixed to the surface of the substrate by an adhesive or other joining material or element, since the insulating film is formed at least on the surface portions of the conductive cap to be contacted with the terminal electrodes, thereby securing the insulation between the terminal electrodes on the substrate and the conductive cap. Thus, an electronic component having a greatly reduced height is efficiently produced.

According to another preferred embodiment of the present invention, a method of forming an insulating film of a conductive cap for sealing an electronic component, which is fixed to the surface of the substrate of the electronic component having terminal electrodes disposed thereon so as to cover and seal an element mounted onto the surface of the substrate, the insulating film being adapted to electrically insulate the terminal electrodes from the conductive cap, wherein the insulating film is formed on the surface of the conductive cap by electrodeposition coating.

According to this preferred embodiment of the present invention, the insulating film can be formed in the cap-shaped state. Accordingly, for any cap-shape, the insulating film can be formed on the surface of the portions of the conductive cap to be contacted with the terminal electrodes when the conductive cap is fixed to the surface of the substrate. The conductive cap alone can be fixed to the surface of the substrate by an adhesive or other joining material or element to achieve sealing.

As the electrodeposition according another preferred embodiment of the present invention, a conventional generally-used electrodeposition coating method can be adopted. The electrodeposition coating can be performed by use of acationic or anionic electrodeposition coating material and by setting the conductive cap as a cathode or anode.

Preferably, a conductive double side adhesion tape is bonded to a conductive supporting sheet, and the metallic cap is bonded to the conductive double side adhesion tape, electrically connected, supported, and electrodeposition-coated. According to this method, many conductive caps can be simultaneously bonded to the double side adhesion tape to be supported and fixed. Thus, many metallic caps can be electrodeposition coated simultaneously and efficiently.

Also preferably, the electrodeposition-coating is carried out while the conductive cap is supported by a jig, and electrically connected. According to this method, the cap can be held and fixed by the simple jig.

According to a further preferred embodiment of the present invention, there is provided a conductive cap for sealing an electronic component, which is fixed to the surface of the substrate of the electronic component having terminal electrodes disposed thereon so as to cover and seal an element mounted onto the surface of the substrate, wherein an insulating film is formed at least on the portions of the conductive cap to be contacted with the terminal electrodes by electrodeposition coating.

Other features, characteristics, elements and advantages of the present invention will become apparent from the following description of preferred embodiments thereof with reference to the attached drawings.

DETAILED DESCRIPTION OF PREFERRED EMBODIMENTS

Figure 1A:
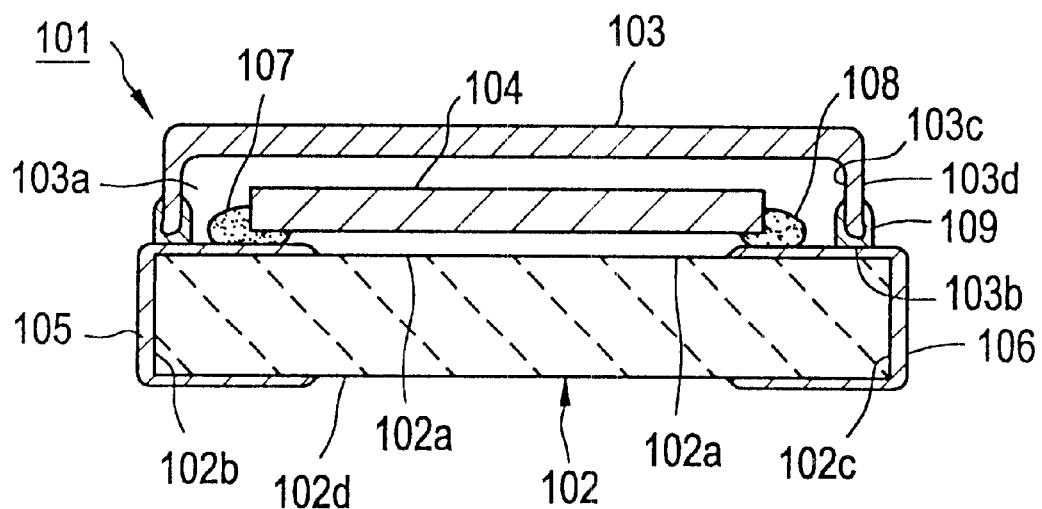
FIG. 1A is a cross-sectional view showing an electronic component having a cap according to a preferred embodiment of the present invention.
Figure 1B:
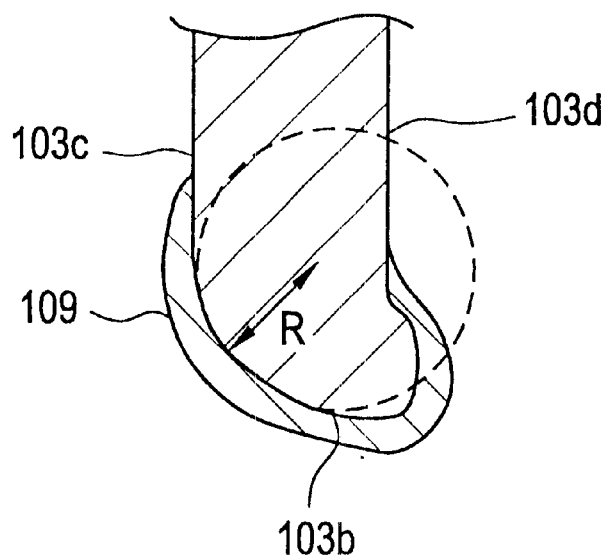
FIG. 1B is a fragmentary enlarged sectional view showing the essential component of the electronic component of FIG. 1A.

FIG. 1A is a cross-sectional view of an electronic component according to a preferred embodiment of the present invention. FIG. 1B is a fragmentary sectional view showing the essential portion of the electronic component shown in FIG. 1A.

The package of an electronic component with a cap 101 preferably includes a substrate 102 and a metallic cap 103 that defines a conductive cap. A piezoelectric element 4 is accommodated in the package.

The substrate 102 is preferably made of insulating ceramic such as alumina or other suitable material, and preferably has a substantially rectangular shape. The substrate 102 may be made of another insulating material such as synthetic resin or other suitable.

Terminal electrodes 105 and 106 are arranged to extend from the upper surface 102a of the substrate 102 onto the lower surface 102d via the end surfaces 102b and 102c, respectively. The above-mentioned piezoelectric element 104 is fixed to the upper surface 102a of the substrate 102 by conductive bonding agents 107 and 108 such as solder or other suitable material. The conductive bonding agents 107 and 108 also electrically connect the electrodes (not shown) of the piezoelectric element 104 to the terminal electrodes 105 and 106, respectively.

As the piezoelectric element 104, an element utilizing an appropriate piezoelectric effect such as a piezoelectric resonator, a piezoelectric filter, or other suitable element may be included.

In order to seal the piezoelectric element 104, a metallic cap 103 is bonded to the upper surface 102a of the substrate 102 by an insulating adhesive (not shown). The metallic cap 103 has an opening 103a at the lower portion thereof. An insulating film 109 is provided on the end surface 103b of the opening, and on the portions of the inner surface 103c and the outer surface 103d in connection to and in the vicinity of the opening end surface 103b.

A metallic material for forming the metallic cap 103 has no limitations. For example, aluminum, stainless steel, and so forth may be used.

Figure 2A:
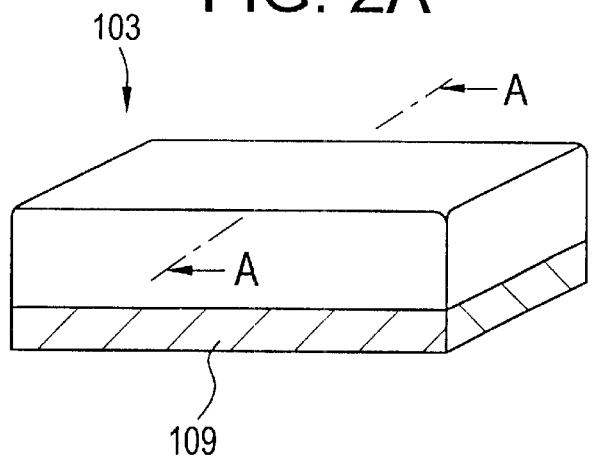
FIG. 2A is a perspective view showing a conductive cap included in the electronic component having a cap according to a preferred embodiment of the present invention.
Figure 2B:
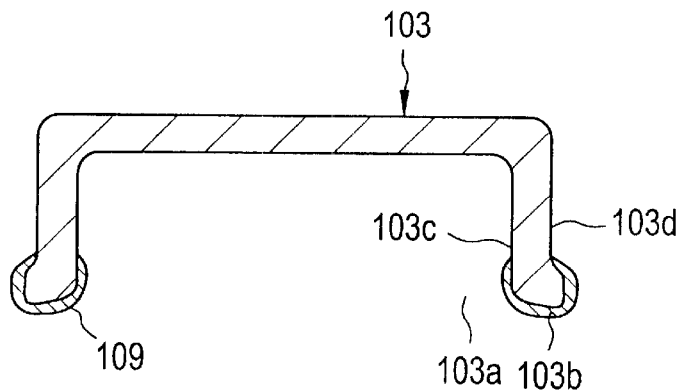
FIG. 2B is a cross-sectional end view taken along line A—A of FIG. 2A.
Figure 2C:
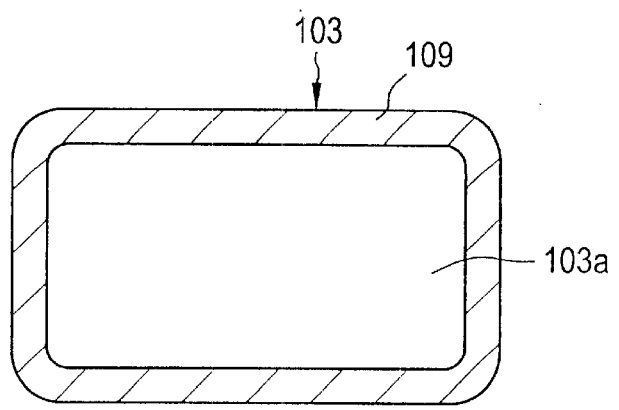
FIG. 2C is a bottom view of the conductive cap of FIG. 2A.

The metallic cap 103 preferably has a substantially rectangular shape, as shown in FIGS. 2A, 2B, and 2C. The metallic cap 103 can be simply obtained by forming a sheet metallic material. Further, the insulating film 109 is formed on the metallic cap 103 according to a method described later.

One of the characteristics of the electronic component 101 of this preferred embodiment is how the insulating film 109 is formed on the metallic cap 103. The structure of the portion of the metallic cap 103 where the insulating film 109 is formed will be described in detail with reference to FIG. 1B.

When the portion of the metallic cap 103 near to the opening is viewed in section taken perpendicularly relative to the circumferential direction of the opening 103a of the metallic cap 103, as shown in FIG. 1B, the opening end surface 103b of the metallic cap 103 to be bonded to the terminal electrode 105 and 106 of the metallic cap 103, and the inner-side surface 103c in connection to the opening end surface 103b define a curved line. The radius R of curvature of the curved line is preferably in the range of about 80 $\mu$m to about 150 $\mu$m. The insulating film 109 is formed on the opening end surface 103b, and portions of the inner-side surface 103c and the outer-side surface 103d in the vicinity of the opening end surface 103b.

The insulating film 109 may be made of appropriate insulating materials. Preferably, an insulating resin capable of being melted and coated is used to form the insulating film 109 because of the resultant advantages in the production process described later. More preferably, as the insulating resin, a resin having a heat resistance that is durable to heat generated when the electronic component having the cap is mounted onto a printed circuit board by are flow-soldering method. Further, preferably, the insulation resistance of the insulating film 109 is about $10^9$ Ω or higher.

When an appropriate insulating synthetic resin such as epoxy resin, polyimide resin, or other such material is used as material for forming the insulating film 109, the thickness of the insulating film 109 preferably about 4 $\mu$m or more so that the insulation resistance becomes about $10^9$ Ω or higher. If the thickness of the insulating film 109 is less than about 4 $\mu$m, the insulation resistance is reduced, and probably, the reliability is deteriorated. The insulating film 109 is not especially restricted to the upper limit from the viewpoint of securing the insulation resistance. However, if the thickness exceeds about 25 $\mu$m, the thickness of the insulating film adhering to the opening end surface 103b of the metallic cap 103 and the side surfaces 103c and 103d in connection to the opening end surface 103b becomes large, the inner size of the metallic cap 103 becomes small, and the outer dimension thereof becomes larger. Accordingly, it is necessary to prepare a large substrate 102, and moreover, the size of the piezoelectric element 104 to be accommodated has a limitation.

Desirably, the opening end surface 103b of the metallic cap 103, and the inner-side surface 103c in connection to the opening end surface 103b are arranged so that the radius R of curvature shown in FIG. 1B is in the range of about 80 $\mu$m to about 150 $\mu$m, as described above. If the radius R of curvature is less than about 80 $\mu$m, the contact areas between the metallic cap 103 and the terminal electrodes 105 and 106 on the substrate 102 are reduced. This may deteriorate the reliability with which the metallic cap 103 is bonded to the substrate 102. Further, the insulating film 109 is difficult to adhere to the metallic cap 103, so that the insulating layer 109 having a sufficient thickness is difficult to form. On the other hand, if the radius R of curvature exceeds about 150 $\mu$m, metallic burrs or edges are readily formed on the opening end surface 103b of the metallic cap 103, which makes the insulating film 109 difficult to adhere to the opening end surface 103b.

Desirably, the insulating resin for forming the above-described insulating film 109 has a melt viscosity suitable for coating on to the metallic cap 103. Preferably, a resin having a viscosity at a temperature of about 25±5° C. of about 5000 cps to about 20000 cps is preferably used. For a resin having a viscosity of less than about 5000 cps, an insulating film having a sufficient film thickness is formed from the resin with much difficulty, if it is applied by a transfer method, and unless the number of transfer cycles is increased. In order to attain an insulating film 109 having an appropriate thickness, it is desirable that the thickness is not less than about 5000 cps. On the other hand, if the viscosity exceeds about 20000 cps, the thickness of the insulating film 109 formed by transfer-processing one time becomes excessively thick, causing problems similar to those of the case where the thickness of the insulating film 109 exceeds about 25 $\mu$m.

Next, a method of forming the insulating film 109 on the metallic cap 103 will be described with reference to FIGS. 3 and 4.

Figure 3:
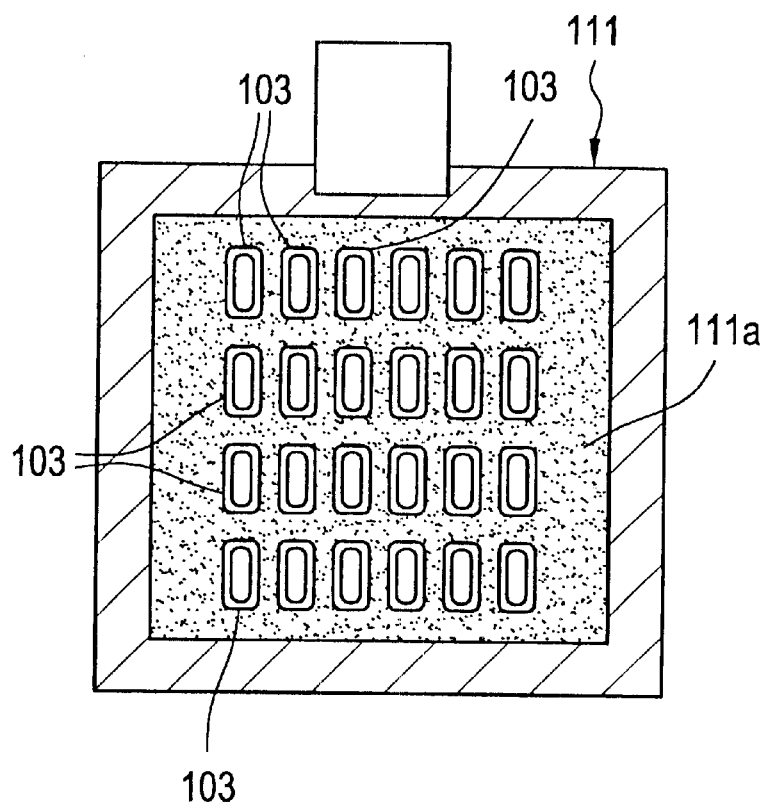
FIG. 3 is a bottom view showing a conductive cap held by a holding device in a preferred embodiment of the present invention.

According to this method, a supporting device 111 is prepared as shown in the bottom view of FIG. 3. A rubber layer 111a having pressure sensitive adhesive properties is provided on the lower surface of the supporting device 111. The rubber layer 111a having pressure-sensitive adhesive properties is preferably made of an appropriate silicone or acryl type of pressure-sensitive adhesive.

A plurality of metallic caps 103 are bonded to the pressure-sensitive adhesive rubber layer 111a. The top surfaces of the respective metallic caps 103 are bonded to the rubber layer 111a, respectively.

The plurality of metallic caps 103 are preferably arranged in a matrix as shown in FIG. 3.

In order to bond the plurality of metallic caps 103 to the supporting device 111, the plurality of metallic caps 103 are preferably arranged in a matrix and placed on a stage (not shown) beforehand. The rubber layer 111a of the supporting device 111 is lowered from above the metallic caps 103 and is contacted with the top surfaces of the metallic caps 3.

Figure 4:
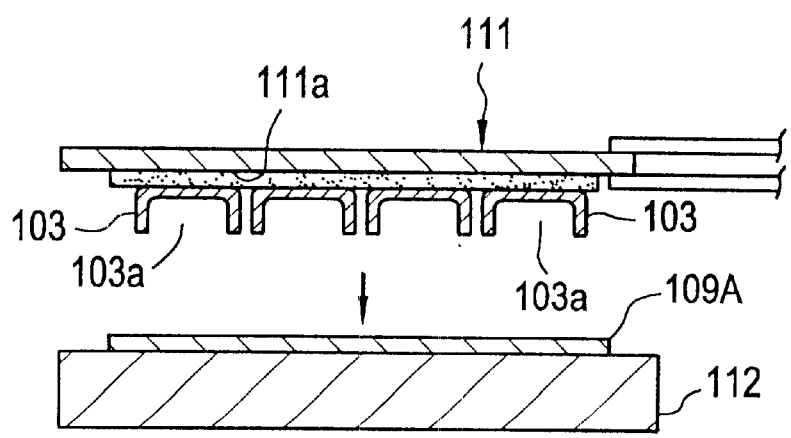
FIG. 4 is a cross-sectional view illustrating a process of forming an insulating film on a conductive cap by a transfer method.

After this, the metallic caps 103 supported on the supporting device 111 are lowered toward an insulation film formation stage 112, as shown in FIG. 4. On the upper surface 112a of the insulating film formation stage 112, an insulating resin layer 109A is provided. The insulating resin layer 109A is formed by melting and coating a resin to form the above-mentioned insulating film 109. The insulating resin layer 109A has not been dried yet and is conditioned to have a viscosity at about 25±5° C. in the range of about 5000 cps to about 20000 cps.

Accordingly, the opening surfaces 103a of the metallic caps 103 supported on the supporting device 111 are contacted with the insulating resin layer 109A, and thereafter, the metallic caps 103 are lifted, whereby the insulating resin is coated on the circumferential edge of the opening 103a of each metallic cap 103. After this, the coated insulating resin is dried to define the above-mentioned insulating film 109.

According to the method of forming an insulating film of this preferred embodiment, the insulating film 109 can be securely and simply formed on the plural metallic caps 103 by the transfer method. Preferably, the transfer process is carried out several times. That is, even if pinholes are formed in the insulating film 109 formed by transfer ring one time, short-circuiting between the metallic caps 103 and the terminal electrodes 105 and 106, caused by the pinholes, can be securely prevented by repeating the transfer process many times.

After the insulating film 109 is formed on the metallic caps 103 as described above, the metallic caps 103 are bonded to the substrate 102 having a piezoelectric element mounted thereto by an insulating adhesive. In this case, the insulating adhesive is coated on the circumferential edge of the opening of each metallic cap 103. The metallic caps 103 are bonded to the substrate 102 one by one. This is because each piezoelectric element 4 must be securely sealed within the package in the process of bonding the metallic caps 103 to the substrate 102 by the insulating adhesive, and therefore, the bonding process are carried out with high precision.

In particular, in the transfer process of forming the insulating film 109 not requiring such a high precision, the plurality of metallic caps 103 can be processed one time and simultaneously as described above. On the other hand, in the process of bonding the metallic caps 103 to the substrate 102, the plurality of metallic caps 103 cannot be bonded to the substrate 102 at the same time. In other words, in the process of forming the insulating film 109 by the above-described transfer method, the insulating film 109 can be formed easily and efficiently, since the plurality of metallic caps 103 can be processed at the same time.

The process of bonding the metallic caps 103 to the upper side of the substrate 102 by the insulating adhesive may be carried out according to a conventional method such as that disclosed in Japanese Unexamined Patent Application Publication No. 11-121916 and Japanese Unexamined Patent Application Publication No. 11-126961.

Figure 5A:
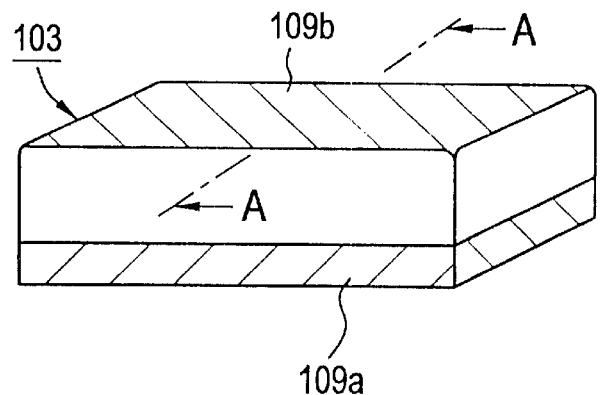
FIG. 5A is a perspective view of a conductive cap according to another preferred embodiment of the present invention.
Figure 5B:
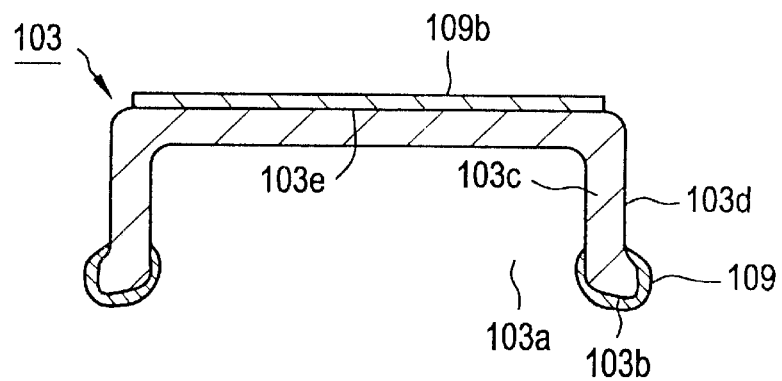
FIG. 5B is a sectional end surface view taken along line A—A of FIG. 5A.
Figure 5C:
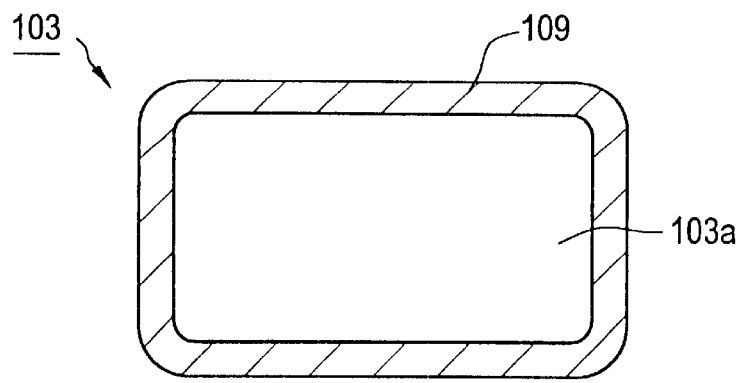
FIG. 5C is a bottom view of the conductive cap of FIG. 5A.
Figure 6:
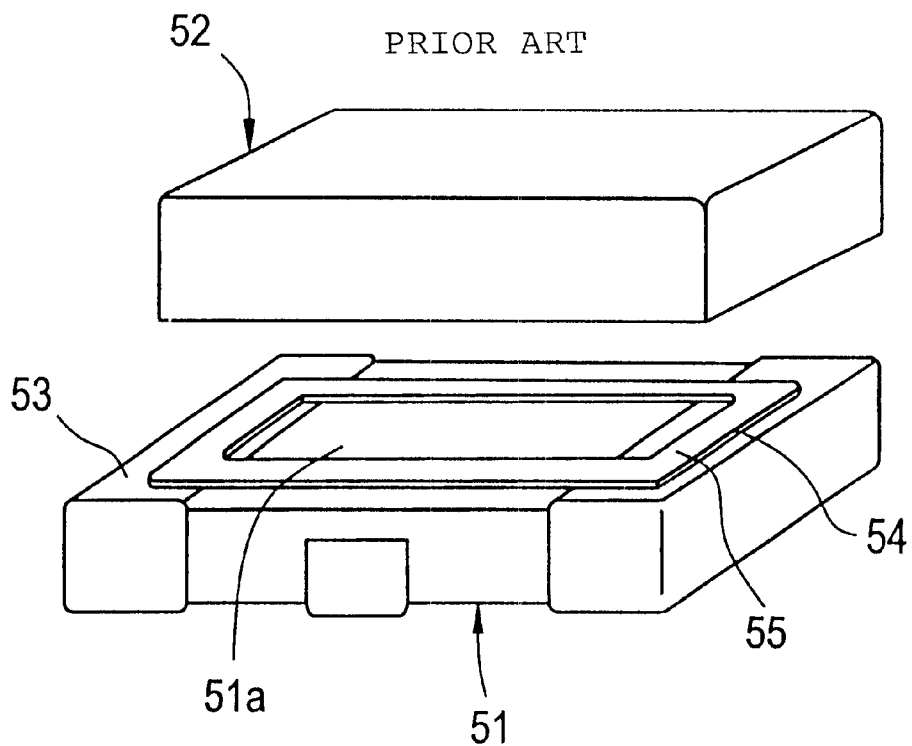
FIG. 6 is a perspective view illustrating an example of a conventional electronic component having a cap.
Figure 7:
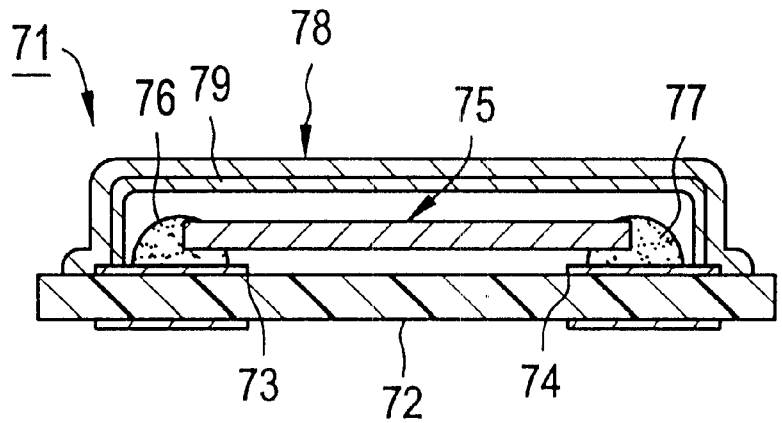
FIG. 7 is a longitudinal cross-sectional view showing an example of a conventional chip piezoelectric resonation portion.

In the above-described preferred embodiment, the insulating film 109 is provided on the opening end surface 103b of each metallic cap 103 and the vicinity thereof. According to the method of producing a conductive cap of preferred embodiments of the present invention, the insulating film may be formed on the upper surface 103e of the metallic cap 103. That is, the insulating film 109b may be formed on the upper surface 103e of the metallic cap 103, as shown in FIGS. 5A, 5B, and 5C. By forming the insulating film 109b on the upper surface 103e of the metallic cap 103, short-circuiting caused by the contact between the conductive component 101 having a cap and other elements or wires can be securely prevented.

In the above-described preferred embodiment, as the electronic component having a cap, a chip piezoelectric resonance component having the piezoelectric element 104, as shown in FIG. 4, accommodated therein is illustrated as an example. Various preferred embodiments of the present invention may be applied to an appropriate electronic component having a cap in which an electronic component element is accommodated in the package including a substrate and the conductive cap. That is, as the electronic component element, an electronic component element other than the piezoelectric element may be used.

Further, as the conductive cap, the metallic cap 3 is described, but the present invention is not limited thereto. A conductive cap produced by forming a conductive film on the surface of a cap made of an insulating material such as insulating ceramic, e.g., alumina, and synthetic resin, and other suitable material may be used, for example.

Figure 8:
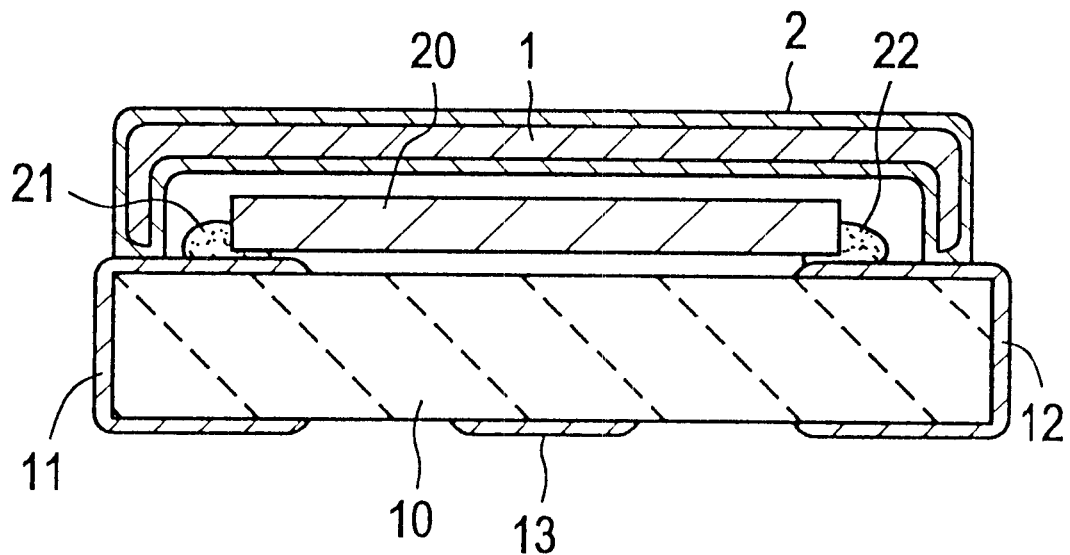
FIG. 8 is a cross-sectional view showing an example of an electronic component using a metallic cap having an insulating film formed according to preferred embodiments of the present invention.

FIG. 8 is a cross-sectional view showing an electronic component provided with a metallic cap having an insulating film disposed thereon according to a preferred embodiment of the present invention.

Terminal electrodes 11 and 12 are provided on the end surfaces, the upper surface, and the lower surface in the opposite end-portions of a substrate 10 such as a dielectric substrate or other suitable substrate. Further, a terminal electrode 13 is provided at the approximate center of the lower surface of the substrate 10. Capacitors are defined between the terminal electrodes 11 and 13 and between the terminal electrodes 12 and 13. Another capacitor is defined between the terminal electrodes 11 and 12. Moreover, internal electrodes may be provided in the substrate 10 so as to be contacted with the terminal electrodes 11 and 12. A capacitor may be produced between these internal electrodes.

An element 20 such as a piezoelectric resonation element or other suitable element is mounted on the upper surface of the substrate 10. One end of the element 20 is bonded to the terminal electrode 11 by solder 21, and the other end is bonded to the terminal electrode 12 with solder 22. Further, a metallic cap 1 is fixed to the upper surface of the substrate 10 so as to cover and seal the element 20. The metallic cap 1 is preferably made of aluminum or an alloy thereof. An insulating film 2 is provided on the surface of the metallic cap 1. The insulating film 2 is formed by anodization of the surface of the metallic cap 1. The thickness of the insulating film 2 is preferably in the range of about 3 $\mu$m to about 30 $\mu$m.

The insulating film 2 is interposed between the terminal electrodes 11, 12 and the metallic cap 1, as shown in FIG. 8. Hence, the metallic cap 1 is prevented from directly contacting the terminal electrodes 11 and 12, that is, sufficient insulation can be maintained between terminal electrodes 11, 12. The metallic cap 1 may be bonded to the substrate 10 by an appropriate adhesive or other suitable joining material or member.

FIGS. 9A, 9B, and 9C to FIGS. 13A, 13B, and 13C show examples of the area in the surface of each metallic cap where the insulating film is formed. FIGS. 9A to 13A are perspective views of the metallic caps, respectively. FIGS. 9B to 13B are cross-sectional views taken along lines A—A in FIGS. 9A to 13A, respectively. FIGS. 9C to 13C show the bottoms of the metallic caps, namely, the surfaces thereof to be contacted with substrates, respectively. In the respective figures, the area where the insulating film is provided is shown cross-hatched.

Figure 9A:
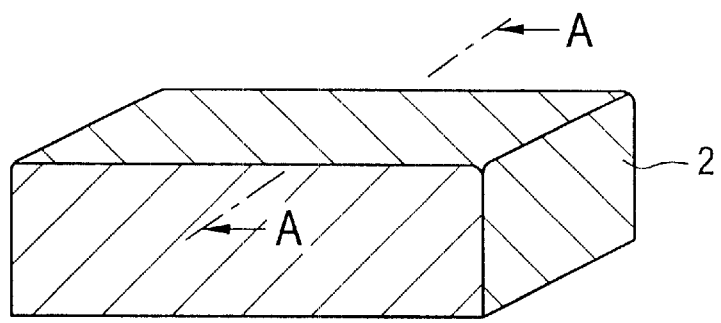
FIG. 9A is a perspective view showing a metallic cap according to another preferred embodiment of the present invention.
Figure 9B:
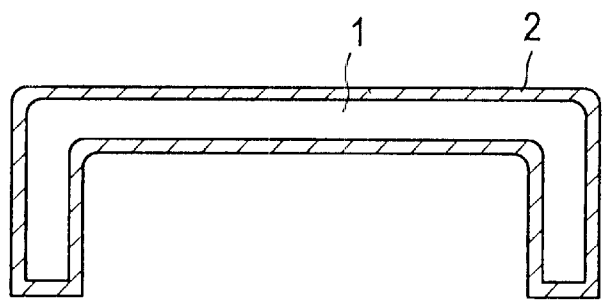
FIG. 9B is a cross-sectional view taken along line A—A of FIG. 9A.
Figure 9C:
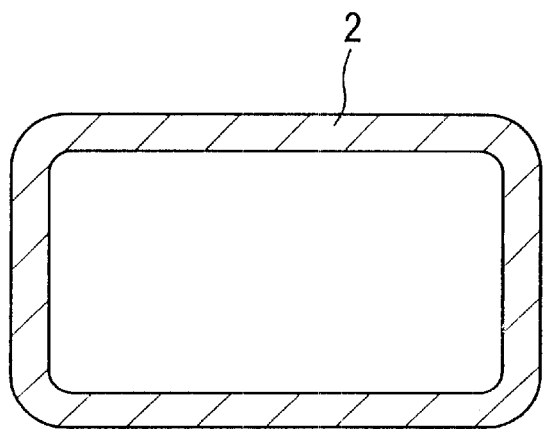
FIG. 9C is a bottom view of the metallic cap of FIG. 9A.

As shown in FIGS. 9A–9C, the insulating film 2 may be arranged to extend along the entire surface of the metallic cap 1. In the preferred embodiment of FIGS. 9A–9C, the insulating film 2 is disposed on the whole of the outer surface of the metallic cap 1, the inner surface, and the bottom to be contacted with the substrate when the metallic cap 1 is fixed to the substrate. By forming the insulating film 2 on the entire surface of the metallic cap 1, the electrical insulation is maintained, and the electrical characteristics of the electronic component are prevented from being deteriorated, when the electronic component is mounted onto a circuit board, even if the electronic component contacts other elements. In addition, the insulating film 2 is disposed on the inner surface of the metallic cap 1. Hence, the insulation between the elements and solders or other elements located inside of the metallic cap 1 is maintained.

Figure 10A:
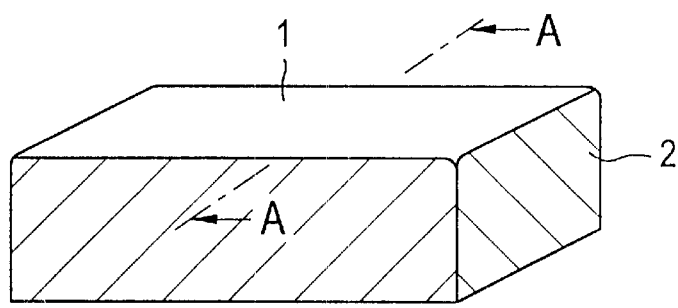
FIG. 10A is a perspective view of a metallic cap according to a further preferred embodiment of the present invention.
Figure 10B:
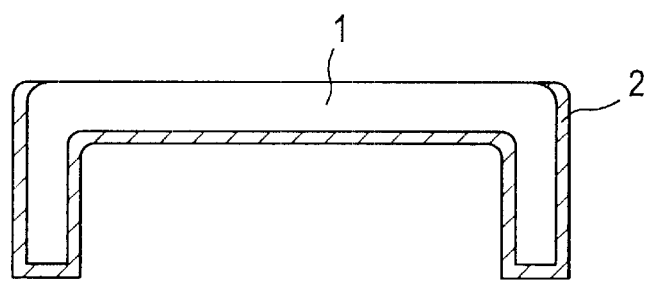
FIG. 10B is a cross-sectional view taken along line A—A of FIG. 10A.
Figure 10C:
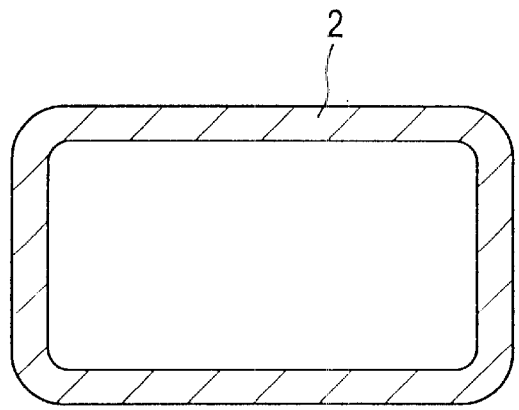
FIG. 10C is a bottom view of the metallic cap of FIG. 10A.

In the preferred embodiment of FIG. 10, the insulating film 2 is disposed on the surface of the metallic cap 1 excluding the outer upper surface thereof. When no insulating film is formed on the upper surface of the metallic cap 1, as described above, the insulation between the metallic cap and the terminal electrodes can be checked by utilization of the upper surface of the metallic cap 1.

Figure 11A:
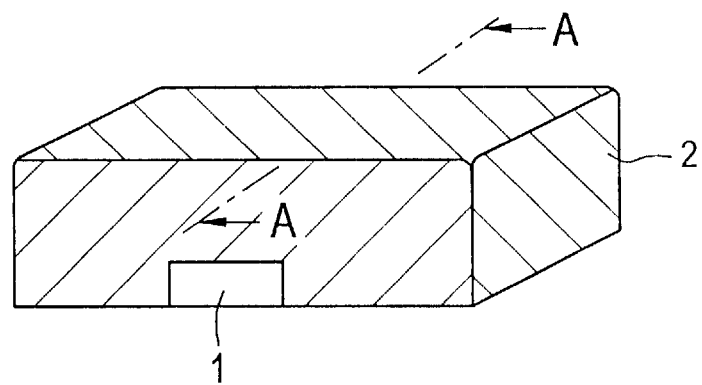
FIG. 11A is a perspective view of a metallic cap according to a still further preferred embodiment of the present invention.
Figure 11B:
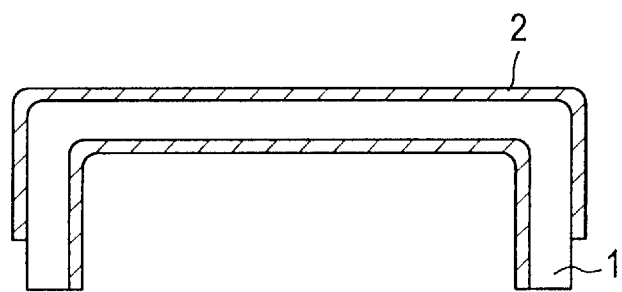
FIG. 11B is a cross-sectional view taken along line A—A of FIG. 11A.
Figure 11C:
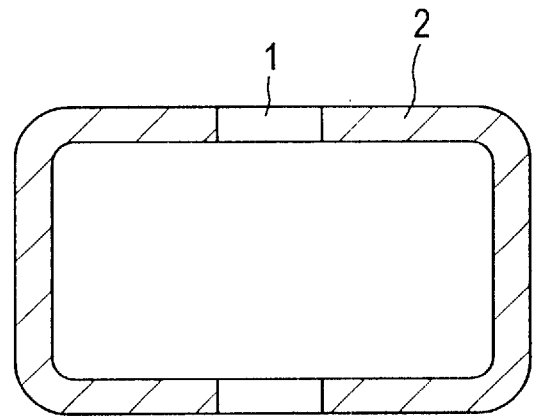
FIG. 11C is a bottom view of the metallic cap of FIG. 11A.

In the preferred embodiment of FIG. 11, the area where no insulating film 2 is formed is provided in the approximate center of each side surface of the metallic cap 1. Also the area where no insulating film is formed is extended onto the bottom surface of the metallic cap 1. Care should be taken so that the area where the insulating film is formed does not contact the terminal electrodes. Such an insulating film pattern of the metallic cap can be formed e.g., in the anodization of a hoop material as described later. By connecting a ground to the area where no insulating film 2 is formed, the metallic cap 1 provides a shielding function.

Figure 12A:
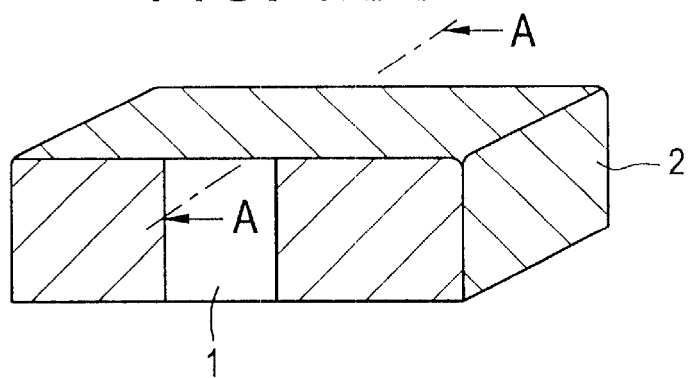
FIG. 12A is a perspective view of a metallic cap according to another preferred embodiment of the present invention.
Figure 12B:
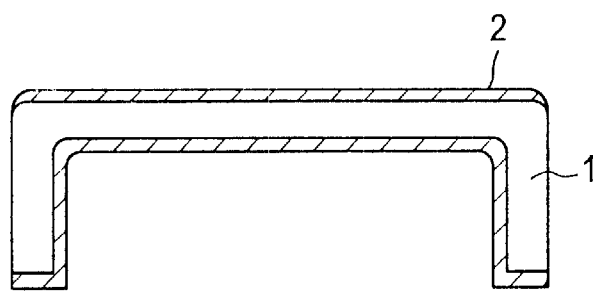
FIG. 12B is a cross-sectional view taken along line A—A of FIG. 12A.
Figure 12C:
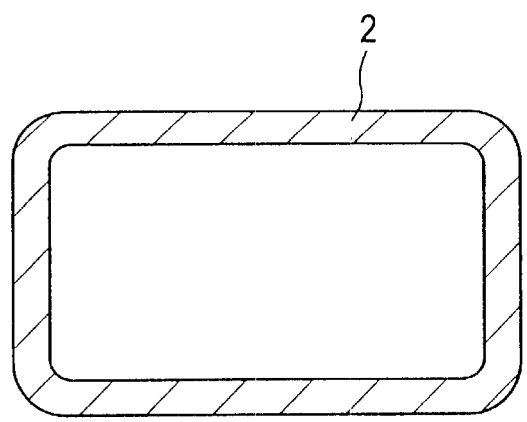
FIG. 12C is a bottom view of the metallic cap of FIG. 12A.
Figure 13A:
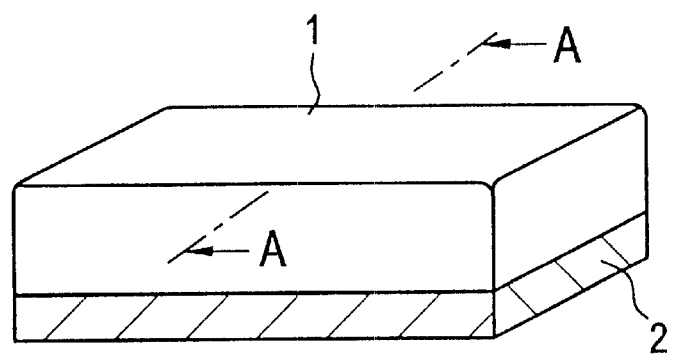
FIG. 13A is a perspective view of a metallic cap according to yet another preferred embodiment of the present invention.
Figure 13B:
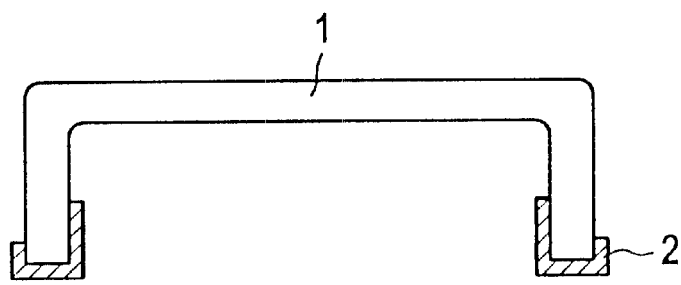
FIG. 13B is a cross-sectional view taken along line A—A of FIG. 13A.
Figure 13C:
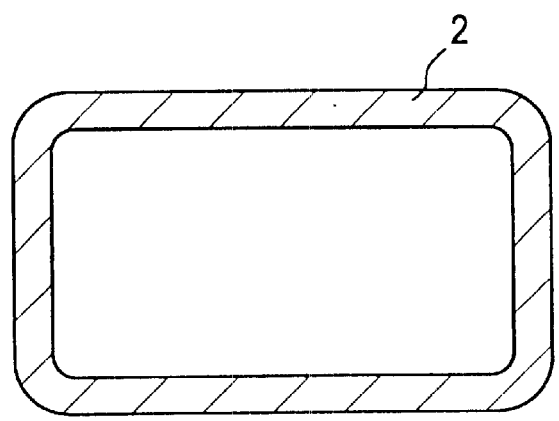
FIG. 13C is a bottom view of the metallic cap of FIG. 13A.

In the preferred embodiment of FIG. 12, the area where no insulating film 2 is formed is provided at the approximate center of each side surface of the metallic cap. Also, this metallic cap 1 can provide a shielding function by connecting a ground to the area where no insulating film 2 is formed.

In the preferred embodiment of FIG. 13, the insulating film 2 is provided only on the lower end-portion of the metallic cap 1. That is, the insulating film 2 is disposed on the lower end portions on the outer side and the inner side of the metallic cap 1 and on the bottom thereof. Also the metallic cap 1 can provide a shielding function by connecting a ground to the area where no insulating film 2 is formed.

As described above, according to a preferred embodiment of the present invention, the area where no insulating film is formed has no limitation. The insulating film only has to be provided on the surfaces of the metallic cap so as to contact the terminal electrodes.

Figure 14:
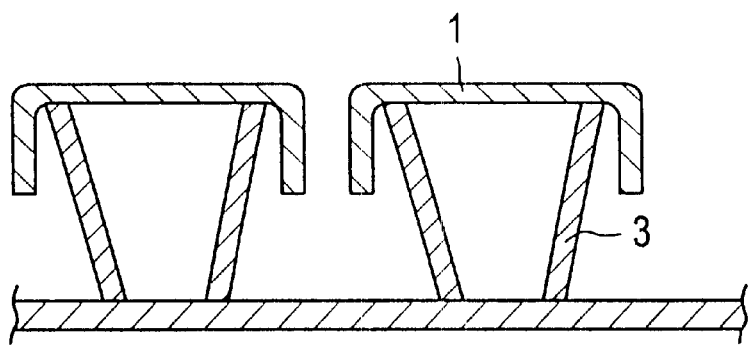
FIG. 14 is across-sectional view illustrating the metallic cap when it is anodization-treated according to a preferred embodiment of the present invention.

FIG. 14 is a cross-sectional view illustrating a method of forming an insulating film according to a preferred embodiment of the present invention. In this preferred embodiment, a metallic cap 1 is electrically connected while the cap 1 is held by a jig 3, set as an anode, and anodized. As the jig 3, a metallic spring piece capable of fixing the metallic cap 1 on the inside thereof may be used. The anodization as described above is suitable when the metallic caps 1 are separated and discrete from each other.

Figure 15:
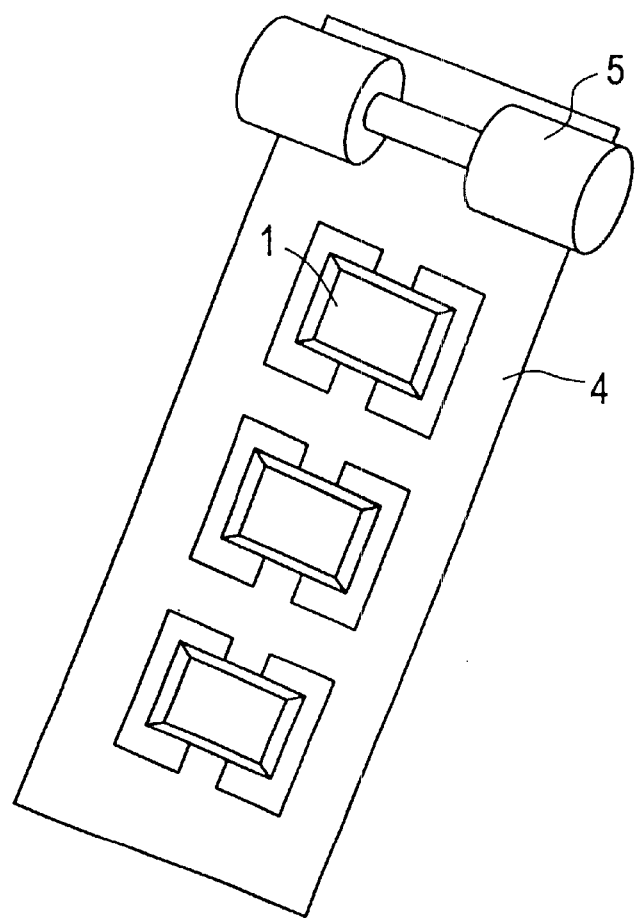
FIG. 15 is a perspective view illustrating a further preferred embodiment of the present invention.

FIG. 15 is a perspective view illustrating anodization according to another preferred embodiment of the present invention. In this preferred embodiment, caps 1 are connected to each other in a hoop 4. The hoop 4 is obtained after a sheet material is punched and formed into cap shapes and before the caps 1 are removed from the punched potions of the hoop 4. In order to electrically connect the metallic caps 1 in the hoop 4, for example, a conduction roll 5 shown in FIG. 15 is contacted with the hoop 4.

Figure 16:
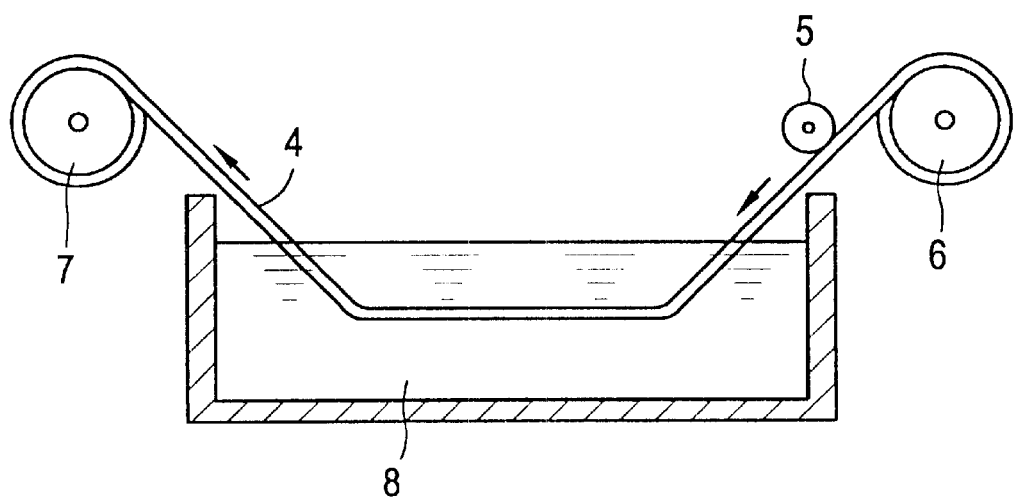
FIG. 16 is a cross-sectional view illustrating a still further preferred embodiment of the present invention.

FIG. 16 shows an example of continuously anodizing the hoop 4 of FIG. 15. The hoop 4 is wound around a feeding roll 6, and fed from the roll 6 to an anodization bath 8. The hoop 4 is contacted with the conduction roll 5 and is in electrical conduction. In the anodization bath 8, the metallic caps 1 are anodized, whereby an oxidized film is formed on the caps 1. The hoop 4, after the anodization, is wound around a take-up roll 7. Thus, the metallic caps 1 in the hoop 4 can be continuously anodized.

Figure 17:
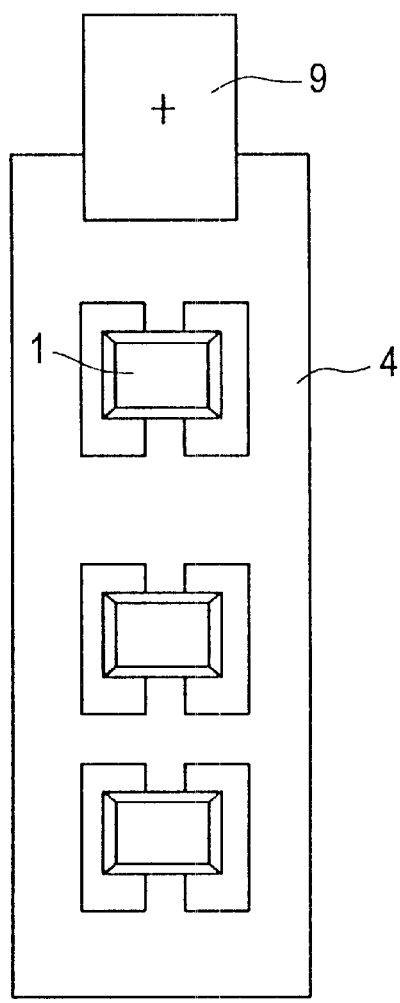
FIG. 17 is a front view illustrating another preferred embodiment of the present invention.

FIG. 17 is a front view illustrating anodization according to a further preferred embodiment of the present invention. In this preferred embodiment, the hoop 4 cut to a predetermined unit length is used. The cut hoop 4 is dipped in an anodization bath and anodized. That is, the hoop 4 is anodized by a batch system. The hoop 4 is held by a holding device 9 under electrical conduction, and in this state, is dipped into the anodization bath, so that an insulating film made of an oxidized film is formed on the surface of the caps.

After the anodization is carried out in the hoop state as described above, the metallic caps 1 are removed from the hoop 1. In this case, the metal caps 1 are cut off from the hoop 4 at the connection portions in the hoop 4. No insulating film is formed in the cut-off portions. Accordingly, a metallic cap having an insulating film pattern as shown in FIG. 11 can be produced.

Figure 18:
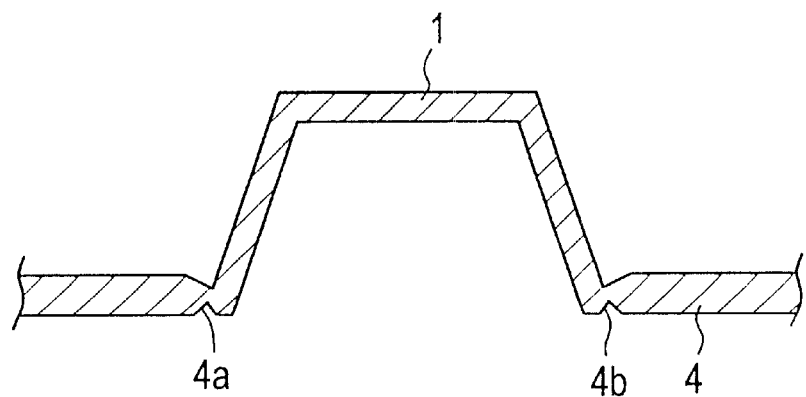
FIG. 18 is a cross-sectional view showing the state in which connection portions between a metallic cap in a hoop are provided with a cut-in, respectively.

FIG. 18 is a cross-sectional view showing cuts 4a and 4b provided in the connection portion between the metallic cap 1 and the hoop 4. By providing the cuts 4a and 4b to reduce the thickness of the connection portion, the metallic cap can be easily removed from the hoop 4 after the anodization.

Figure 19:
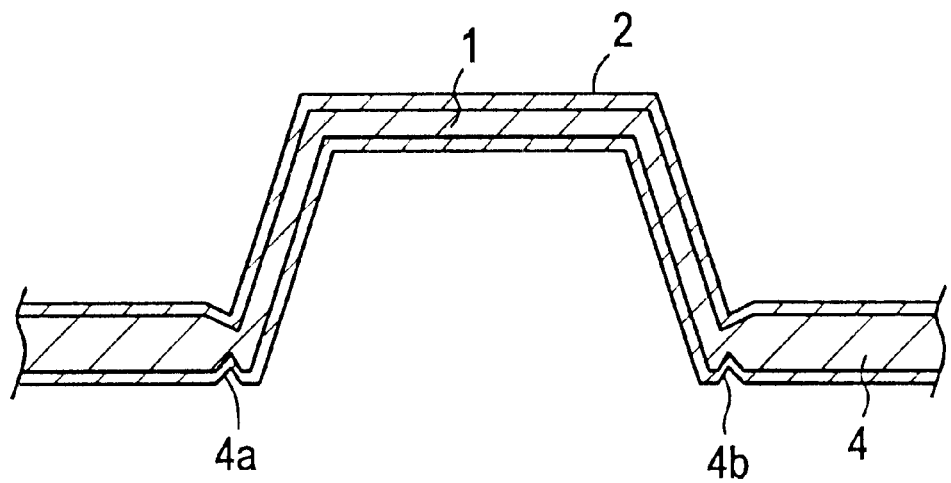
FIG. 19 is a cross-sectional view showing the state in which the hoop shown in FIG. 18 has been anodized.
Figure 20:
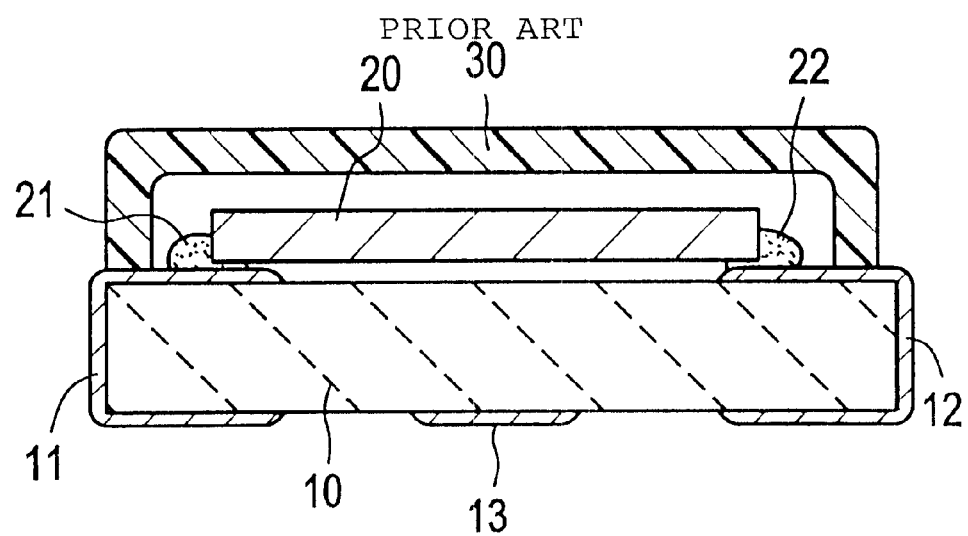
FIG. 20 is a cross-sectional view showing an example of a conventional electronic component.
Figure 21:
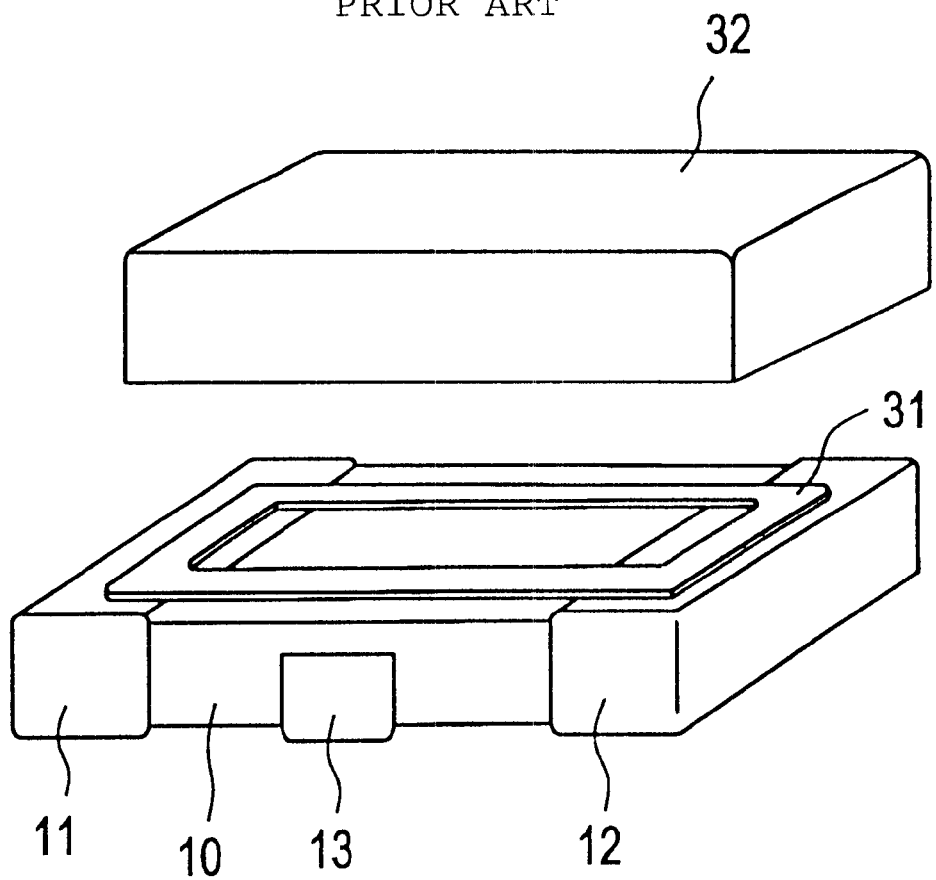
FIG. 21 is a perspective view showing an example of a conventional electronic component.

FIG. 19 shows the state in which the anodization has been carried out. As shown in FIG. 19, insulating films 2, which are oxidized films, are formed on the front and back surfaces of the hoop 4. The insulating film 2 has a uniform thickness disposed over the hoop 4. In the portions where the cuts are 4a and 4b are formed, the thickness of the metallic sheet becomes very small. Accordingly, the metallic caps 1 can be removed by applying a small external force.

The cuts 4a and 4b shown in FIG. 18 may be formed so as to have a depth that is substantially equal to about a half the thickness of the metallic sheet.

In the above-described preferred embodiments, as the substrate for mounting an element, a substrate such as a dielectric substrate or other suitable substrate is described. The present invention is not restricted to the dielectric substrate. For example, an insulating substrate or other substrate may be included.

Figure 22:
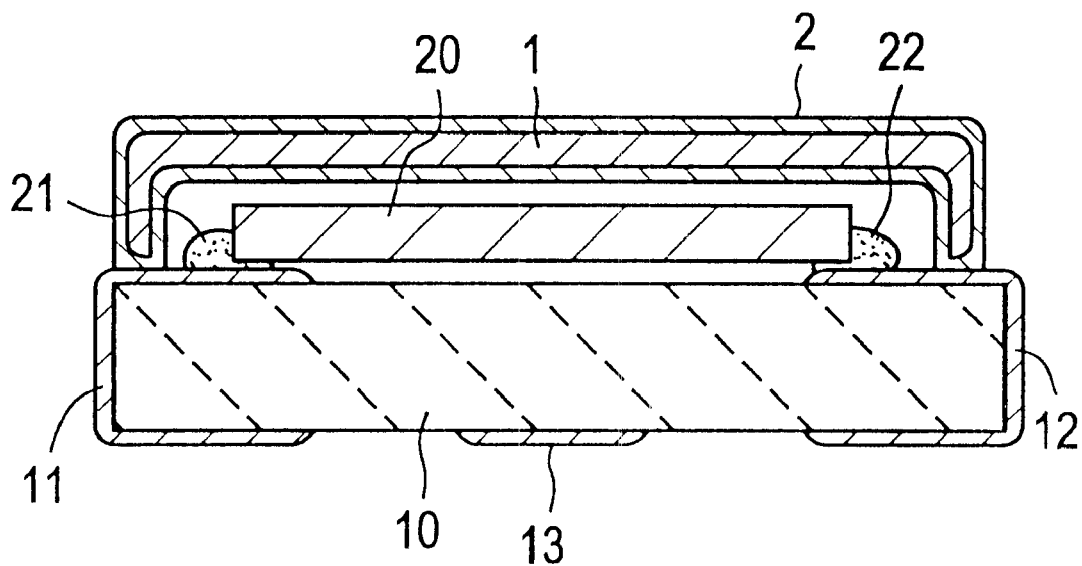
FIG. 22 is a cross-sectional view showing an example of an electronic component using a metallic cap having an insulating film formed according to preferred embodiments of the present invention.
Figure 23A:
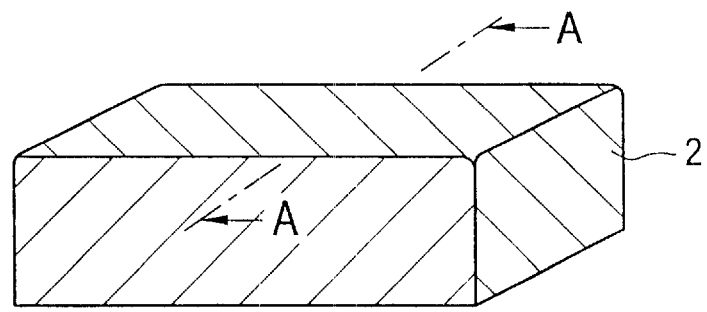
FIG. 23A is a perspective view showing a metallic cap according to a preferred embodiment of the present invention.
Figure 23B:
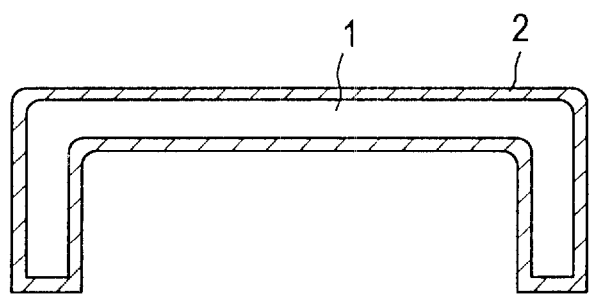
FIG. 23B is a cross-sectional view taken along line A—A in FIG. 23A.
Figure 23C:
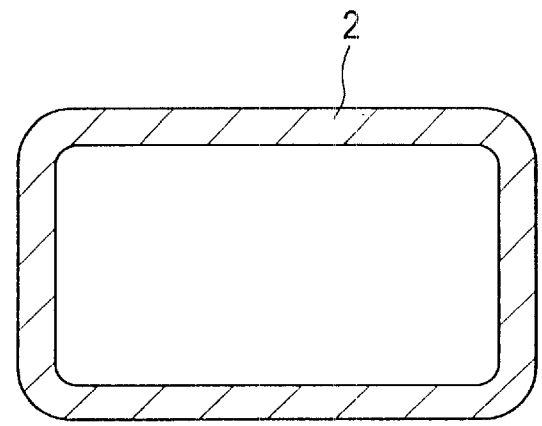
FIG. 23C is a bottom view thereof according to FIG. 23A.

FIG. 22 is a cross-sectional view showing an electronic component provided with a metallic cap having an insulating film formed thereon according to a preferred embodiment of the present invention.

Terminal electrodes 11 and 12 are formed on the end surfaces, the upper surface, and the under surface in the opposite end-portions of a substrate 10 such as a dielectric substrate or other suitable substrate. Further, a terminal electrode 13 is provided at the approximate center of the lower surface of the substrate 10. Capacitors are defined between the terminal electrodes 11 and 13 and between the terminal electrodes 12 and 13. Another capacitor is defined between the terminal electrodes 11 and 12. Moreover, internal electrodes may be provided in the substrate 10 so as to be contacted with the terminal electrodes 11 and 12. A capacitor may be defined between these internal electrodes.

An element 20 such as a piezoelectric resonation element or other electronic element is mounted onto the upper surface of the substrate 10. One end of the element 20 is bonded to the terminal electrode 11 by solder 21, and the other end is bonded to the terminal electrode 12 with solder 22. Further, a metallic cap 1 is fixed to the upper surface of the substrate 10 so as to cover and seal the element 20. The metallic cap 1 is preferably made of aluminum or an alloy thereof. An insulating film 2 is disposed on the surface of the metallic cap 1. The insulating film 2 is formed by anodization of the surface of the metallic cap 1. The thickness of the insulating film 2 is preferably in the range of about 3 $\mu$m to about 30 $\mu$m.

The insulating film 2 is interposed between the terminal electrodes 11, 12 and the metallic cap 1, as shown in FIG. 22. Hence, the metallic cap 1 is prevented from directly contacting with the terminal electrodes 11 and 12, that is, sufficient insulation can be maintained between the terminal electrodes 11, 12. The metallic cap 1 may be bonded to the substrate 10 by an appropriate adhesive or other suitable joining material or member.

FIGS. 23A, 23B, and 23C to FIGS. 27A, 27B, and 27C show examples of the area in the surface of each metallic cap where the insulating film is formed. FIGS. 23A to 27A are perspective views of the metallic caps, respectively. FIGS. 23B to 27B are cross-sectional views taken along lines A—A in FIGS. 23A to 27A, respectively. FIGS. 23C to 27C show the bottoms of the metallic caps which are the surfaces thereof to be contacted with substrates, respectively. In the respective figures, the area where the insulating film is provided is cross-hatched.

As shown in FIG. 23, the insulating film 2 may be arranged along the entire surface of the metallic cap 1. In the preferred embodiment of FIG. 9, the insulating film 2 is disposed on the entire outer surface of the metallic cap 1, the inner surface, and the bottom to be contacted with the substrate when the metallic cap 1 is fixed to the substrate. By forming the insulating film 2 on the entire surface of the metallic cap 1, the electrical insulation can be maintained, and the electrical characteristics of the electronic component can be prevented from being deteriorated, when the electronic component is mounted onto a circuit board, even if the electronic component contacts with other elements. In addition, the insulating film 2 is formed on the inner surface of the metallic cap 1. Hence, the insulation between the elements and solders or other elements located inside of the metallic cap 1 can be maintained.

Figure 24A:
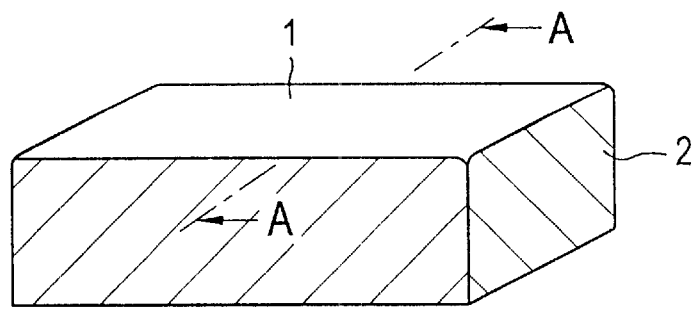
FIG. 24A is a perspective view showing a metallic cap according to a further preferred embodiment of the present invention.
Figure 24B:
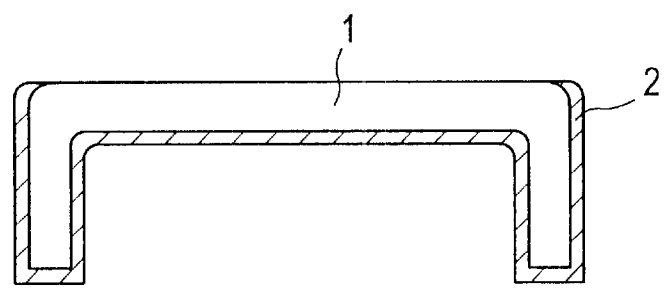
FIG. 24B is a cross-sectional view taken along line A—A in FIG. 24A.
Figure 24C:
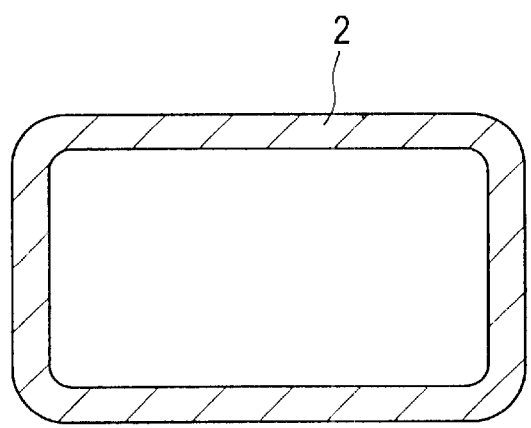
FIG. 24C is a bottom view of the metallic cap of FIG. 24A.

In the preferred embodiment of FIG. 24, the insulating film 2 is provided on the surface of the metallic cap 1 excluding the outer upper surface thereof. In the case where no insulating film is formed on the upper surface of the metallic cap 1, as described above, the insulation between the metallic cap and the terminal electrodes can be checked by utilization of the upper surface of the metallic cap 1.

Figure 25A:
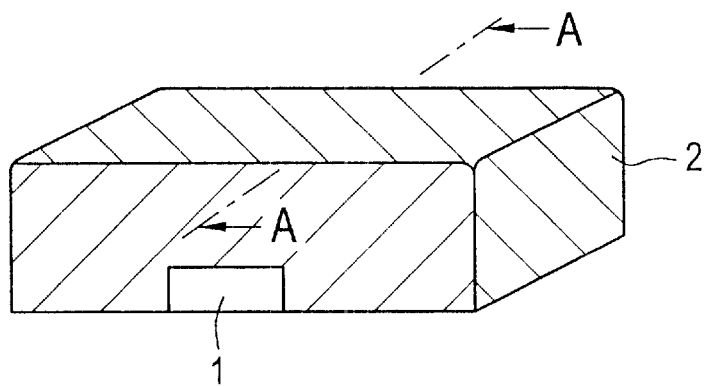
FIG. 25A is a perspective view showing a metallic cap according to still a further preferred embodiment of the present invention.
Figure 25B:
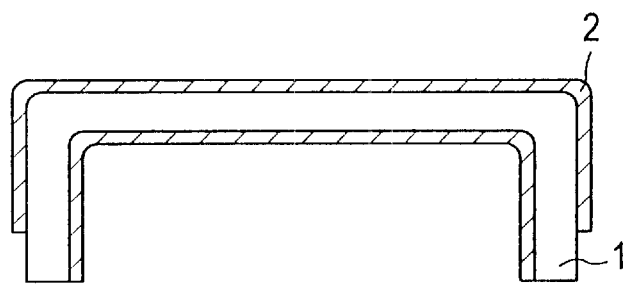
FIG. 25B is a cross-sectional view taken along line A—A in FIG. 25A.
Figure 25C:
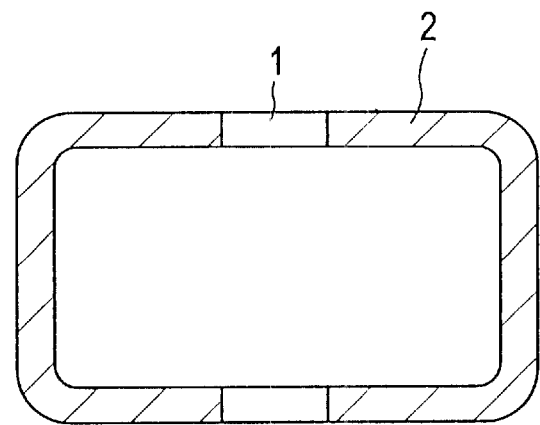
FIG. 25C is a bottom view of the metallic cap of FIG. 25A.

In the preferred embodiment of FIG. 25, the area where no insulating film 2 is formed is provided at the approximate center of each side surface of the metallic cap 1. Also the area where no insulating film is formed is extended onto the lower surface of the metallic cap 1. Care should be taken so that the area where no insulating film is formed does not contact the terminal electrodes. Such an insulating film pattern of the metallic cap can be formed e.g., in the anodization of a hoop material as described later. By connecting a ground to the area where no insulating film 2 is formed, the metallic cap 1 can provide a shielding function.

Figure 26A:
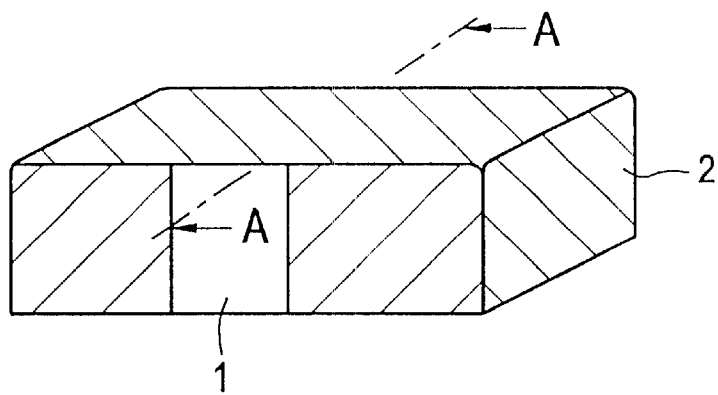
FIG. 26A is a perspective view showing a metallic cap according to another preferred embodiment of the present invention.
Figure 26B:
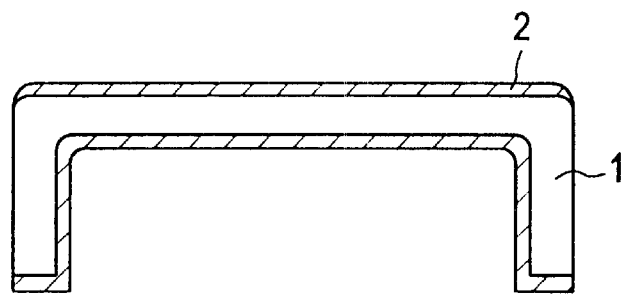
FIG. 26B is a cross-sectional view taken along line A—A in FIG. 26A.
Figure 26C:
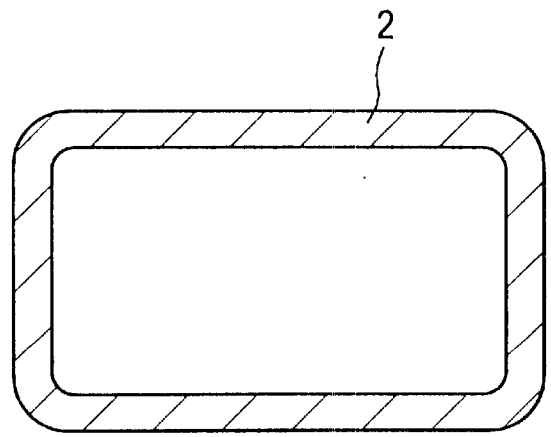
FIG. 26C is a bottom view of the metallic cap of FIG. 26A.
Figure 27A:
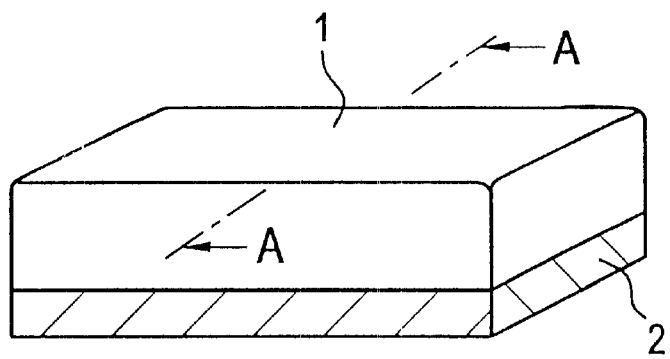
FIG. 27A is a perspective view showing a metallic cap according to yet another preferred embodiment of the present invention.
Figure 27B:
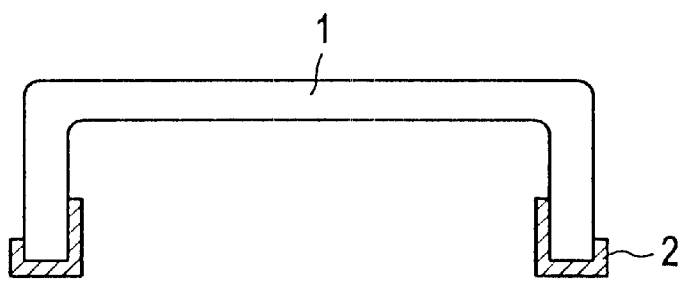
FIG. 27B is a cross-sectional view taken along line A—A in FIG. 27A.
Figure 27C:
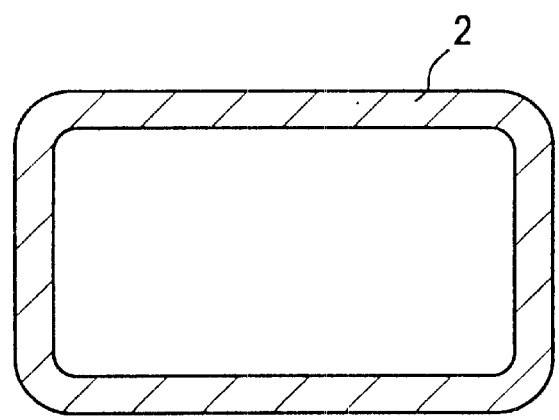
FIG. 27C is a bottom view of the metallic cap of FIG. 27A.

In the preferred embodiment of FIG. 26, the area where no insulating film 2 is formed is provided in the approximate center of each side surface of the metallic cap. Also, this metallic cap can provide a shielding function by connecting a ground to the area where no insulating film is formed.

In the preferred embodiment of FIG. 27, the insulating film 2 is formed only on the lower end-portion of the metallic cap 1. That is, the insulating film 2 is formed on the lower end portions on the outer side and the inner side of the metallic cap 1 and on the bottom thereof. Also the metallic cap 1 can provide a shielding function by connecting a ground to the area where no insulating film 2 is formed.

As described above, according to preferred embodiments of the present invention, the area where no insulating film is formed has no limitation. The insulating film only has to be provided on the surfaces of the metallic cap to be contacted to the terminal electrodes.

Figure 28:
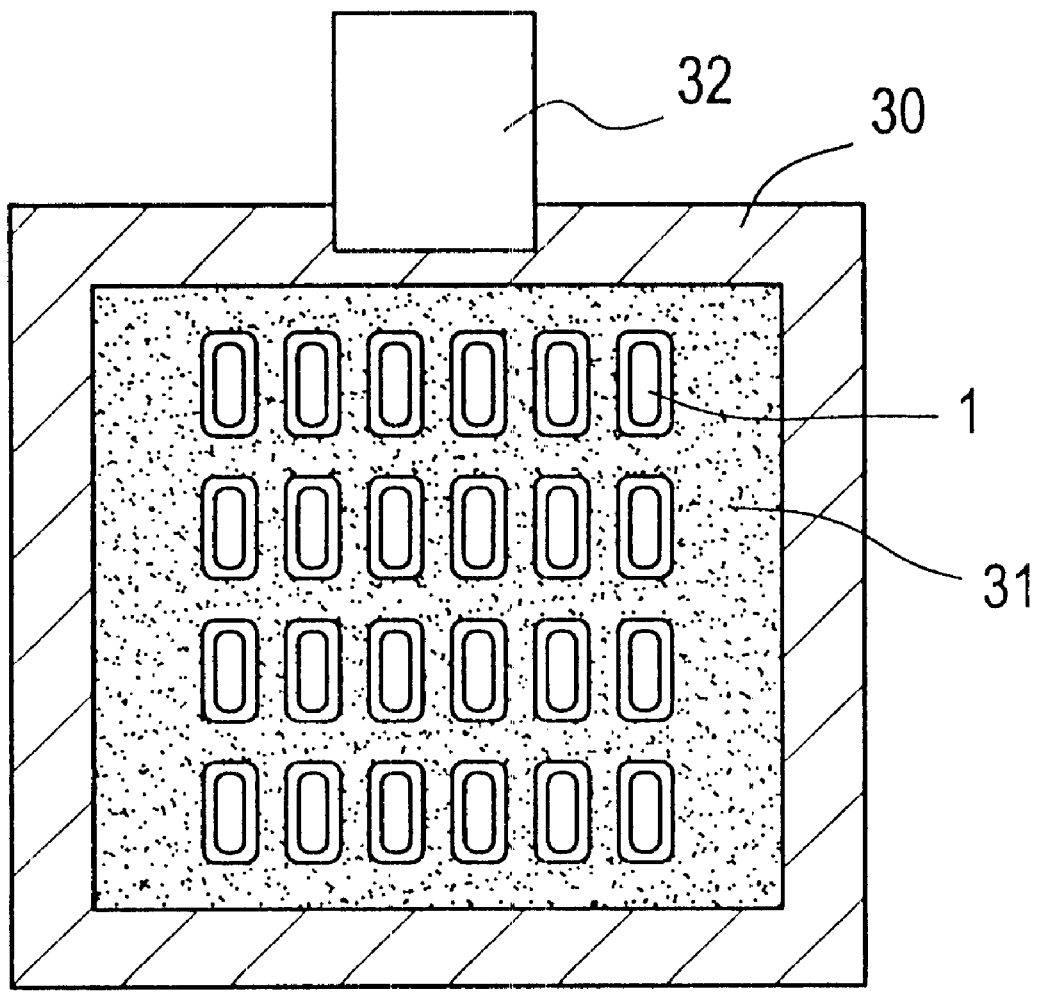
FIG. 28 is a front view illustrating the state in which metallic caps are supported according to a preferred embodiment of the present invention.

FIG. 28 is a cross-sectional view illustrating a method of forming an insulating film according to a first preferred embodiment of the present invention. A conductive double-side adhesion tape 31 is bonded to a conductive support sheet 30 made of a metallic sheet or other suitable material. The conductive double-side adhesion tape 31 has conductive properties by incorporating, e.g., metallic powder, carbon black, or other suitable material therein. A plurality of metallic caps 1 are bonded to the conductive double side adhesion tape 31. The conductive support sheet 30 is supported by a conductive support 32 made of metal or other suitable material.

Figure 29:
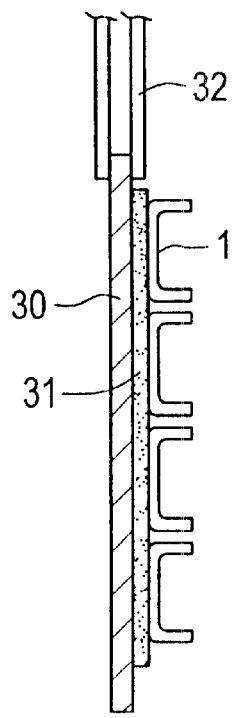
FIG. 29 is a cross-sectional view further illustrating the state of FIG. 28 in which the metallic caps are supported.

FIG. 29 is a cross-sectional view showing the metallic caps 1 of FIG. 28 in a supported state. As seen in FIG. 29, the upper sides of the metallic caps 1 are bonded to the conductive double side tape 31. The metallic caps 1 are electrically conducted to the conductive support sheet 30 via the conductive double side adhesion tape 31. Hence, by setting the conductive support sheet 30 as a cathode or an anode via the support 32, the metallic caps 1 can be made to function as a cathode or anode.

By dipping the metallic caps 1 supported as described above, into an electrodeposition coating material, and setting the metallic caps 1 as a cathode or anode, the material can be electrodeposition-coated on to the exposed surface of the metallic caps 1. That is, an insulating film can be formed by the electrodeposition coating. According to the supporting method of this preferred embodiment, the upper surfaces of the metallic caps 1 are bonded to the conductive double side adhesion tape 31. Accordingly, no insulating film is formed on the upper surfaces of the metallic caps 1. Accordingly, the same insulating film pattern as in the example shown in FIG. 3 can be formed.

Figure 30:
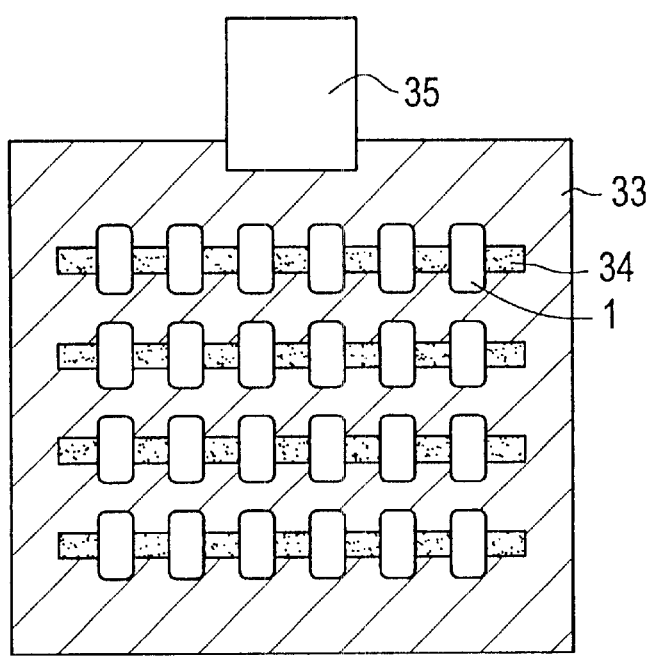
FIG. 30 is a front view illustrating the state in which metallic caps are supported according to a further preferred embodiment of the present invention.
Figure 31:
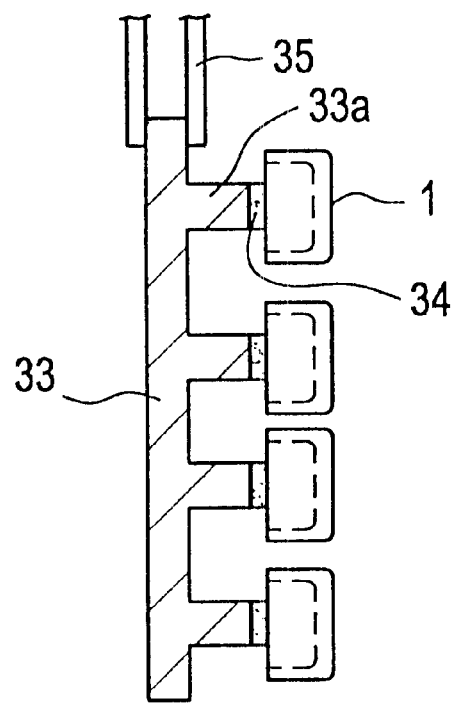
FIG. 31 is a cross-sectional view further illustrating the state of FIG. 30 in which the metallic caps are supported.

FIG. 30 is a front view showing a method of forming an insulating film according to another preferred embodiment of the present invention. FIG. 31 is a cross-sectional view showing the supported state of the metallic caps of FIG. 30.

Referring to FIGS. 30 and 31, protuberances 33a elongating in the lateral direction are disposed on a conductive support sheet 33 made of a metallic sheet or other suitable material, as shown in FIG. 31. Conductive double side adhesion tapes are bonded to the protuberances 33a, respectively. The conductive double bond adhesion tapes have conductive properties by incorporating e.g., metallic powder, carbon black, or other suitable material similarly to the conductive double bond adhesion tape 31 shown in FIGS. 28 and 29. The metallic caps 1 are bonded to the conductive double bond adhesion tapes 34, respectively. As shown in FIG. 31, the bottom of each metallic cap 1 is bonded to the conductive double bond adhesion tape 34. The conductive support sheet 33 is held by a conductive holding device 35 made of metal or other suitable material.

Each metallic cap 1 is electrically connected to the conductive support sheet 33 via the conductive double bond adhesion tape 34. Accordingly, by setting the conductive supporting sheet 33 as a cathode or anode, the metallic cap 1 can be made to function as a cathode or anode. Hence, by dipping the metallic caps 1 supported as described above in an electrodeposition coating material, and setting the metallic caps 1 as a cathode or anode, the material can be electrodeposition-coated onto the surfaces of the metallic caps 1.

The electrodeposition coating has good coating performance. Not only the outer surface of each metallic cap 1 but also the inner surface thereof can be coated. However, the portion of the metallic cap 1 in contact with the conductive double bond adhesion tape 34 is not coated. Thus, no coating film is formed on the approximate center portion of the bottom of the metallic cap 1. Accordingly, the insulating film pattern on the bottom of the metallic cap 1 is similar to that shown in FIG. 25C. Care should be taken so that the areas where no insulating film is formed do not overlap the areas of the terminal electrodes.

Figure 32:
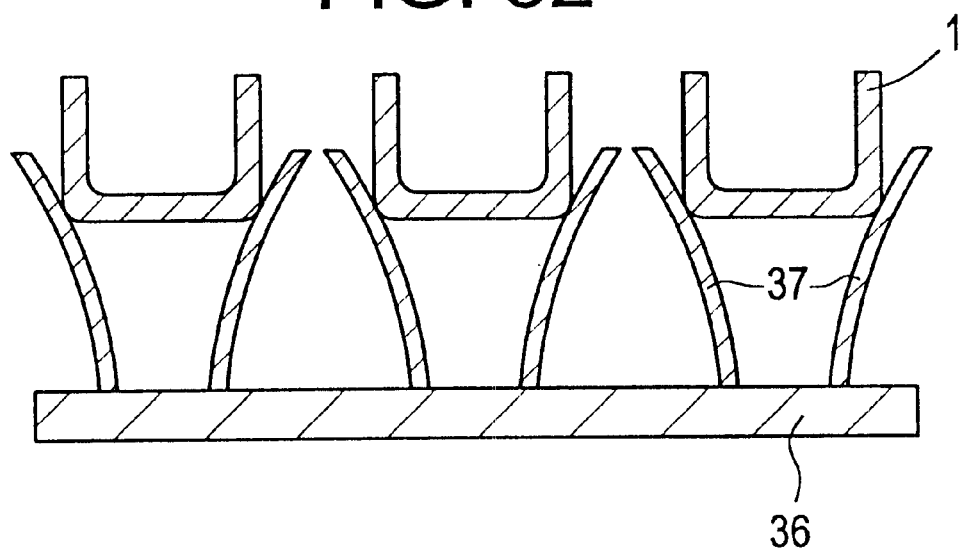
FIG. 32 is a cross-sectional view in which metallic caps are supported according to still a further preferred embodiment of the present invention.

FIG. 32 is a cross-sectional view showing a method of forming an insulating film according to another preferred embodiment of the present invention. In this preferred embodiment, spring members 37 made of a conductive material such as metal or other suitable material are provided. The metallic cap 1 is pushed between the spring members 37 to be supported. The metallic cap 1 is electrically connected to the conductive supporting sheet 36 via the spring members 37. Accordingly, by setting the conductive supporting sheet 36 as a cathode or anode, the metallic cap 1 can be made to function as a cathode or anode.

By dipping the metallic caps 1 supported as described above into an electrodeposition coating material, and setting the metallic caps 1 as a cathode or anode, an insulating film made of an electrodeposition coating film can be formed on the exposed surfaces of the metallic caps 1. In this preferred embodiment, the insulating film can be formed on the surface of each metallic cap 1 excluding the surface portion of the metallic cap 1 in contact with the spring member 37.

As described above, according to various preferred embodiments of the present invention, the insulating film can be formed in the shaped-cap state. Thus, it is unnecessary to form the insulating film, and then carry out bending-work or other conventional processes. A very good insulating film can be formed on the surface portions of the cap to be contacted with the terminal electrodes.

In the above-described preferred embodiments, as the substrate for mounting an element, a substrate such as a dielectric substrate or other suitable substrate may preferably be used as an example. The present invention is not limited to the preferred embodiments described above. For example, an insulating substrate or other substrate may be used.

In the conductive cap of preferred embodiments of the present invention, the end surface of the opening on the lower surface of the cap and the inner and outer side surfaces thereof in connection to and in the vicinity of the end surface is provided with an insulating film disposed thereon. Hence, in the case where the conductive cap is bonded to the upper surface of the substrate having terminal electrodes formed thereon by an insulating adhesive, the conductive cap and the terminal electrodes can be securely prevented from short-circuiting.

Regarding a conventional electronic component having a cap in which an insulating film is formed on the substrate, it becomes difficult to form the insulating film with high precision as the electronic component becomes more miniaturized. This prevents the size of the electronic component from being reduced. On the other hand, when the conductive cap of preferred embodiments of the present invention is used, it is unnecessary to form an insulating film on the substrate. Thus, the conductive cap can sufficiently correspond to the miniaturization.

The insulation resistance between the opening end surface of the conductive cap and the outer side of the insulation film may be at least about $10^9 \Omega$. In this case, short-circuiting between the conductive cap and the terminal electrodes on the substrate is prevented more securely.

Further, the thickness of the insulating film is preferably in the range of about 4 μm to about 25 μm. In this case, the electrical insulation between the conductive cap and the terminal electrodes can be securely performed, the substrate can be prevented from increasing in size, and moreover, limitations in size of an electronic component element to be accommodated can be reduced.

Preferably, when the opening end surface of the conductive cap and its adjacent portion thereof are viewed in a section taken perpendicularly relative to the circumferential direction of the conductive cap, the opening end surface of the cap and the inner side surface thereof connected to the opening end surface define a curved line, and the radius R of curvature of the curved line is preferably in the range of about 80 μm to about 150 μm. In this case, the insulating film having a sufficient thickness can be securely provided on the opening end surface and the vicinity thereof, and thereby, short-circuiting between the terminal electrodes and the conductive cap can be securely prevented.

In the electronic component of various preferred embodiments of the present invention, an electronic component element is fixed to the substrate and electrically connected to the plurality of terminal electrodes on the substrate, and the opening side of the conductive cap according to various preferred embodiments of the present invention is bonded to the substrate so as to cover the electronic component element. Thus, short-circuiting between the conductive cap and the terminal electrodes is securely prevented due to the insulating film disposed on the conductive cap.

In the electronic component of preferred embodiments of the present invention, the electronic component element may be a piezoelectric element. In this case, short-circuiting between the conductive cap and the terminal electrodes on the substrate can be securely prevented. As a result, a piezoelectric component having very high reliability is provided.

In the case where the conductive cap is made of a metallic cap, the conductive cap can be easily formed from a sheet metallic material by drawing or other suitable process.

According to the method of forming an insulating film of an conductive cap of a preferred embodiment of the present invention, a plurality of conductive caps are held while they are arranged by a holding device, the opening end surface side of the plurality of conductive caps held by the holding device are pressed against a resin layer for forming an insulating film having a predetermined thickness, and after this, the conductive caps are separated from the resin layer for forming an insulating film, whereby the insulating film is formed on the opening end surface of the each conductive cap and its vicinity of the end surface by the transfer method, and after the transfer step, the insulating film is dried. As a result, the insulating film can be formed on the plurality of conductive caps efficiently and securely.

The resin for forming an insulating film preferably has a viscosity at about 25±5° C. of about 5000 cps to about 20000 cps, such that an insulating film having excellent electrical insulation properties can be formed securely and easily by repeating the transfer process at a predetermined number of cycles until the insulating film has a film thickness so as to secure sufficient electrical insulation when the insulating film is formed on the conductive cap by the transfer process.

According to the method of forming an insulating film of various preferred embodiments of the present invention, a material formed in a cap shape is anodization-treated whereby an insulating film can be formed on the surface of the portions of the cap-shaped material to be contacted with the terminal electrodes. The resulting conductive cap alone can be bonded to the substrate by an adhesive or other suitable joining material or method. Thus, an electronic component having a greatly reduced height is efficiently produced.

It should be understood that the foregoing description is only illustrative of the present invention. Various alternatives and modifications can be devised by those skilled in the art without departing from the invention. Accordingly, the present invention is intended to embrace all such alternatives, modifications and variations that fall within the scope of the appended claims.

What is claimed is:

1. A conductive cap for use in an electronic component, the conductive cap comprising:

an upper surface, a lower surface and inner and outer side surfaces;

an opening below the lower surface thereof, the cap being adapted to be fixed to the upper surface of a substrate of the electronic component on the opening side of the cap so as to cover at least an electronic component element mounted on the upper surface of the substrate having terminal electrodes disposed thereon; wherein an opening end surface of said conductive cap and the inner and outer side surfaces thereof in connection to and in the vicinity of the end surface are provided with an insulating film formed thereon; and said opening end surface is defined by a curved line having a radius of curvature in the range of about 80 $\mu$m about 150 $\mu$m.

2. A conductive cap according to claim 1, wherein the insulation resistance between the opening end surface of the conductive cap and the outer side of the insulation film is at least about $10^9$ 106 .

3. A conductive cap according to claim 1, wherein the thickness of said insulating film is in the range of about 4 $\mu$m to about 25 $\mu$m.

4. An electronic component comprising:

a substrate having a plurality of terminal electrodes disposed on at least an upper surface thereof;

an electronic component element fixed to the substrate and electrically connected to the plurality of terminal electrodes; and a conductive cap having an opening below a lower surface thereof and an insulating film provided on an opening end surface thereof and an adjacent portion, and bonded to the substrate on the opening end surface of the conductive cap; and said opening end surface is defined by a curved line having a radius of curvature in the range of about 80 $\mu$m to about 150 $\mu$m.

5. An electronic component according to claim 4, wherein said electronic component element is a piezoelectric element.

6. An electronic component according to claim 4, wherein the conductive cap is a metallic cap.

7. A conductive cap for sealing an electronic component, the conductive cap comprising:

a cap body including a lower surface which is adapted to be fixed to a surface of a substrate of the electronic component so as to cover and seal an element mounted onto the surface of the substrate having terminal electrodes disposed thereon, the conductive cap body is made of one of aluminum and an aluminum alloy; and an insulating film is disposed at least on surface portions of the conductive cap to be contacted with the terminal electrodes; wherein an opening end surface of said cap body which is in contact with said insulating film is defined by a curved line having a radius of curvature in the range of about 80 $\mu$m to about 150 $\mu$m.

8. A conductive cap for sealing an electronic component, comprising:

a conductive cap body that is adapted to be fixed to a surface of a substrate of the electronic component having terminal electrodes disposed thereon so as to cover and seal an element mounted onto the surface of the substrate; and an insulating film disposed at least on portions of the conductive cap to be contacted with the terminal electrodes; wherein an opening end surface of said conductive cap body which is in contact with said insulating film is defined by a curved line having a radius of curvature in the range of about 80 $\mu$m to about 150 $\mu$m.

9. A conductive cap for covering and sealing an element mounted onto the surface of a substrate having terminal electrodes formed thereon, wherein said conductive cap has an insulating film disposed at least on a surface of portions of the cap that are arranged to contact the terminal electrodes; wherein said portions of the cap that are arranged to contact the terminal electrodes is defined by a curved line having a radius of curvature in the range of about 80 $\mu$m to about 150 $\mu$m.

* * * * *